(12) United States Patent
Kim et al.

(10) Patent No.: US 7,285,810 B2
(45) Date of Patent: *Oct. 23, 2007

(54) FERROELECTRIC MEMORY DEVICES HAVING EXPANDED PLATE LINES

(75) Inventors: Hyun-Ho Kim, Kyunggi-do (KR); Dong-Jin Jung, Kyunggi-do (KR); Ki-Nam Kim, Kyunggi-do (KR); Sang-Don Nam, Seoul (KR); Kyu-Mann Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 50 days.

This patent is subject to a terminal disclaimer.

(21) Appl. No.: 10/948,610

(22) Filed: Sep. 23, 2004

(65) Prior Publication Data

US 2005/0035384 A1  Feb. 17, 2005

Related U.S. Application Data

(63) Continuation of application No. 10/136,991, filed on May 2, 2002, now Pat. No. 6,844,583.

(30) Foreign Application Priority Data

Jun. 26, 2001  (KR) .............................. 2001-36624
Feb. 4, 2002  (KR) .............................. 2002-06192

(51) Int. Cl.
*H01L 31/0224* (2006.01)
(52) U.S. Cl. .............. 257/295; 257/532; 257/E29.164; 438/3
(58) Field of Classification Search ........ 257/303–308, 257/532, 295
See application file for complete search history.

(56) References Cited

U.S. PATENT DOCUMENTS

| | | | |
|---|---|---|---|
| 5,959,879 A | 9/1999 | Koo | |
| 6,004,839 A | 12/1999 | Hayashi et al. | |
| 6,090,697 A * | 7/2000 | Xing et al. | 438/618 |
| 6,300,654 B1 * | 10/2001 | Corvasce et al. | 257/296 |
| 6,310,374 B1 | 10/2001 | Satoh et al. | |
| 6,410,397 B1 | 6/2002 | Ochiai et al. | |
| 6,521,929 B2 * | 2/2003 | Ozaki | 257/295 |
| 6,521,937 B1 * | 2/2003 | Miyato | 257/303 |
| 6,560,137 B2 * | 5/2003 | Allen et al. | 365/145 |

(Continued)

*Primary Examiner*—Jerome Jackson
*Assistant Examiner*—Paul Budd
(74) *Attorney, Agent, or Firm*—Myers Bigel Sibley & Sajovec PA

(57) ABSTRACT

A ferroelectric memory device includes a microelectronic substrate and a plurality of ferroelectric capacitors on the substrate, arranged as a plurality of rows and columns in respective row and column directions. A plurality of parallel plate lines overlie the ferroelectric capacitors and extend along the row direction, wherein a plate line contacts ferroelectric capacitors in at least two adjacent rows. The plurality of plate lines may include a plurality of local plate lines, and the ferroelectric memory device may further include an insulating layer disposed on the local plate lines and a plurality of main plate lines disposed on the insulating layer and contacting the local plate lines through openings in the insulating layer. In some embodiments, ferroelectric capacitors in adjacent rows share a common upper electrode, and respective ones of the local plate lines are disposed on respective ones of the common upper electrodes. Ferroelectric capacitors in adjacent rows may share a common ferroelectric dielectric region. Related fabrication methods are discussed.

15 Claims, 21 Drawing Sheets

U.S. PATENT DOCUMENTS

| | | | |
|---|---|---|---|
| 6,576,941 B1 * | 6/2003 | Lee et al. | 257/295 |
| 6,593,613 B1 * | 7/2003 | Alsmeier et al. | 257/306 |
| 6,657,883 B2 * | 12/2003 | Takashima | 365/145 |
| 6,844,583 B2 * | 1/2005 | Kim et al. | 257/306 |
| 6,887,720 B2 * | 5/2005 | Joo | 438/3 |
| 6,909,134 B2 * | 6/2005 | Song et al. | 257/296 |
| 6,979,881 B2 * | 12/2005 | Joo et al. | 257/532 |

* cited by examiner

FERROELECTRIC MEMORY DEVICES HAVING EXPANDED PLATE LINES

RELATED APPLICATIONS

The present application is a continuation of U.S. application Ser. No. 10/136,991, filed May 2, 2002 now U.S. Pat. No. 6,844,583, entitled Ferroeleciric Memory Devices Having Expanded Plate Lines, the disclosure of which is hereby incorporated herein by reference. This application also claims the benefit of Korean Patent Application Nos. 2001-3624 and 2002-06192, filed on Jun. 26, 2001 and on Feb. 4, 2002, respectively, the contents of which are herein incorporated by reference in their entirety.

BACKGROUND OF THE INVENTION

The present invention relates to memory devices and methods of fabrication therefor, and more particularly, to ferroelectric memory devices and methods of fabrication therefor.

Typical ferroelectric memory devices can retain data even when de-energized. Similar to DRAMs and SRAMs, ferroelectric memory devices typically operate with a low power supply voltage. Thus, ferroelectric devices are attractive for use in smart cards or the like.

A conventional method of fabricating a ferroelectric memory device will be described with reference to FIG. 1 through FIG. 3. Referring now to FIG. 1, a device isolation layer 13 is formed in a predetermined area of a semiconductor substrate 11 to define an active region. A plurality of insulated gate electrodes 15, i.e., local word lines, is formed across the active region and the device isolation layer 13. Thereafter, impurities are implanted into the active region between the gate electrodes 15 to form source/drain regions 17s and 17d. A first lower interlayer insulating layer 19 is formed on the resultant structure. The first lower interlayer insulating layer 19 is patterned to form storage node contact holes that expose the source regions 17s. Contact plugs 21 are then formed in the storage node contact holes.

Referring to FIG. 2, ferroelectric capacitors 32 are arrayed on the contact plugs 21. Each of the ferroelectric capacitors 32 is composed of a bottom electrode 27, a ferroelectric layer 29, and a top electrode 31. Each of the bottom electrodes 27 covers a respective contact plug 21. A first upper interlayer insulating layer 33 is formed on the ferroelectric capacitors 32. A plurality of main word lines 35 are then formed on the first upper interlayer insulating layer 33. Each of the main word lines 35 generally controls four local word lines 15.

Referring now to FIG. 3, a second upper interlayer insulating layer 37 is formed on the main word lines 35. The second and first interlayer insulating layers 37 and 33 are patterned to form via holes 39 that expose the top electrodes 31. A plurality of plate lines 41 are formed that contact the top electrodes 31 through the via holes 39. The plate lines 41 are arranged to be parallel with the word lines 35.

To reduce an aspect ratio of each of the via holes 39, wet and dry etch techniques can be used. In this case, the via hole 39 tends to have an inclined upper sidewall 39a, as shown in FIG. 3. Unfortunately, excessive wet-etch may result in exposure of the main word lines 35.

As another approach to reduce an aspect ratio of the via hole 39, the diameter of the via hole 39 can be increased. However, a spacing between the via hole 39 and an adjacent main word line 35 tends to decrease with an increase in integration level. This makes precise alignment during a photo process for forming the via hole 39 desirable.

According to the foregoing prior art, decreasing an aspect ratio of the via holes leads to a strong probability that the main word lines will be exposed. Therefore, it is hard to avoid an electric short between the plate line and the main word line as well as a contact failure between the top electrode and the plate line.

SUMMARY OF THE INVENTION

According to some embodiments of the present invention, a ferroelectric memory device includes a microelectronic substrate and a plurality of ferroelectric capacitors on the substrate, arranged as a plurality of rows and columns in respective row and column directions. A plurality of parallel plate lines overlie the ferroelectric capacitors and extend along the row direction, wherein a plate line contacts ferroelectric capacitors in adjacent rows, for example, at least two adjacent rows. At least one of the plate lines may contact the ferroelectric capacitors, which are arrayed in at least two adjacent rows and at least one column. In some embodiments, the ferroelectric capacitors include an upper electrode, and the plurality of plate lines include a plurality of local plate lines that contact the upper electrodes of the ferroelectric capacitors. The plurality of plate lines may include a plurality of local plate lines, and the ferroelectric memory device may further include an insulating layer disposed on the local plate lines and a plurality of main plate lines disposed on the insulating layer and contacting the local plate lines through openings in the insulating layer. Alternatively, a plurality of local plate patterns may be arrayed along the row and column directions instead of the local plate lines. In this case, each of the local plate patterns contacts the upper electrodes of the ferroelectric capacitors, which are arrayed in at least two adjacent rows and at least one column. Preferably, the respective local plate patterns covers four upper electrodes of four ferroelectric capacitors, which are arrayed in two adjacent rows and two adjacent columns. In some embodiments, ferroelectric capacitors in adjacent rows share a common upper electrode, and respective ones of the plate lines are disposed on respective ones of the common upper electrodes. Ferroelectric capacitors in adjacent rows may share a common ferroelectric dielectric region.

According to other embodiments of the present invention, a ferroelectric memory device is fabricated. A plurality of ferroelectric capacitors is formed on a microelectronic substrate, the plurality of ferroelectric capacitors arranged as a plurality of rows and columns in respective row and column directions. A plurality of parallel plate lines are formed on the substrate, overlying the ferroelectric capacitors and extending along the row direction, wherein a plate line contacts ferroelectric capacitors in at least two adjacent rows. The plate lines may include local plate lines. An insulating layer may be formed on the local plate lines, and a plurality of main plate lines may be formed on the insulating layer, respective ones of which contact respective ones of the local plate lines through openings in the insulating layer.

DETAILED DESCRIPTION

Figure 1:
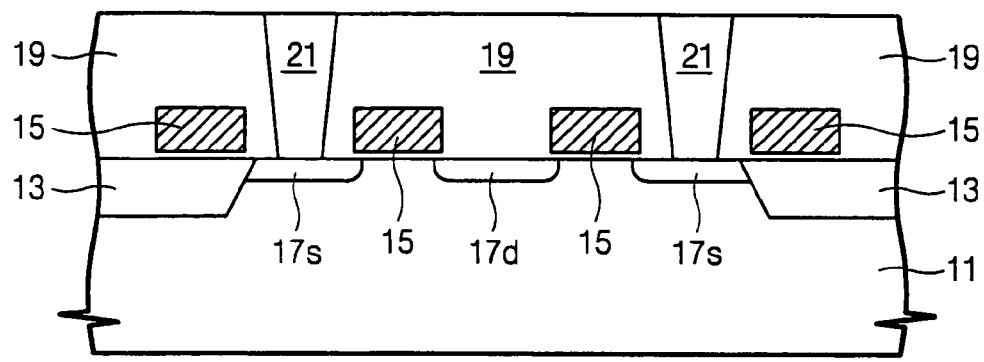
FIGS. 1-3 are cross-sectional views illustrating a conventional process for fabricating a ferroelectric memory device.
Figure 2:
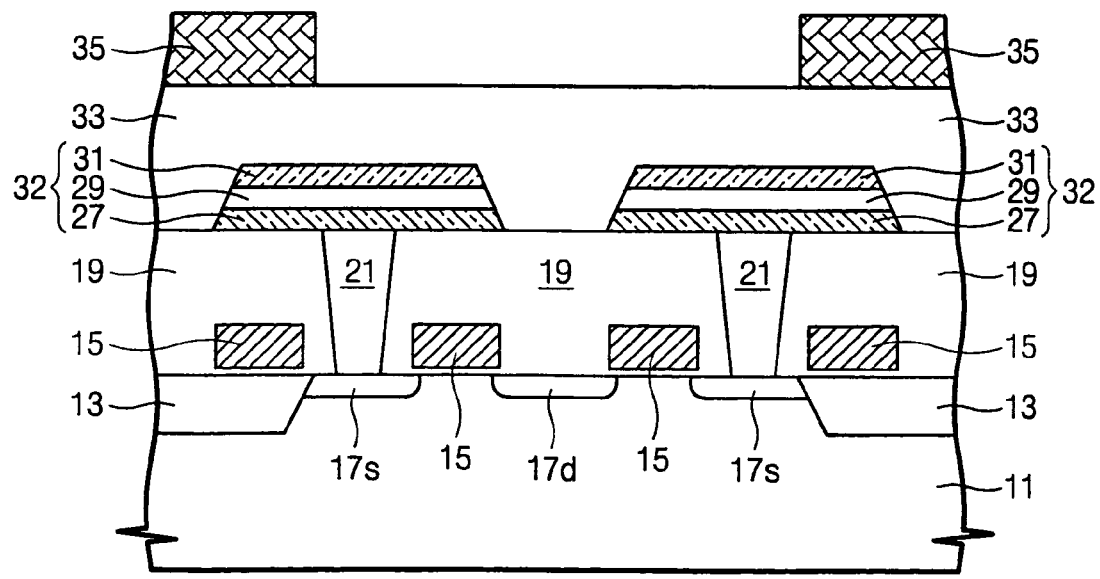

The present invention will now be described more fully hereinafter with reference to the accompanying drawings, in which typical embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
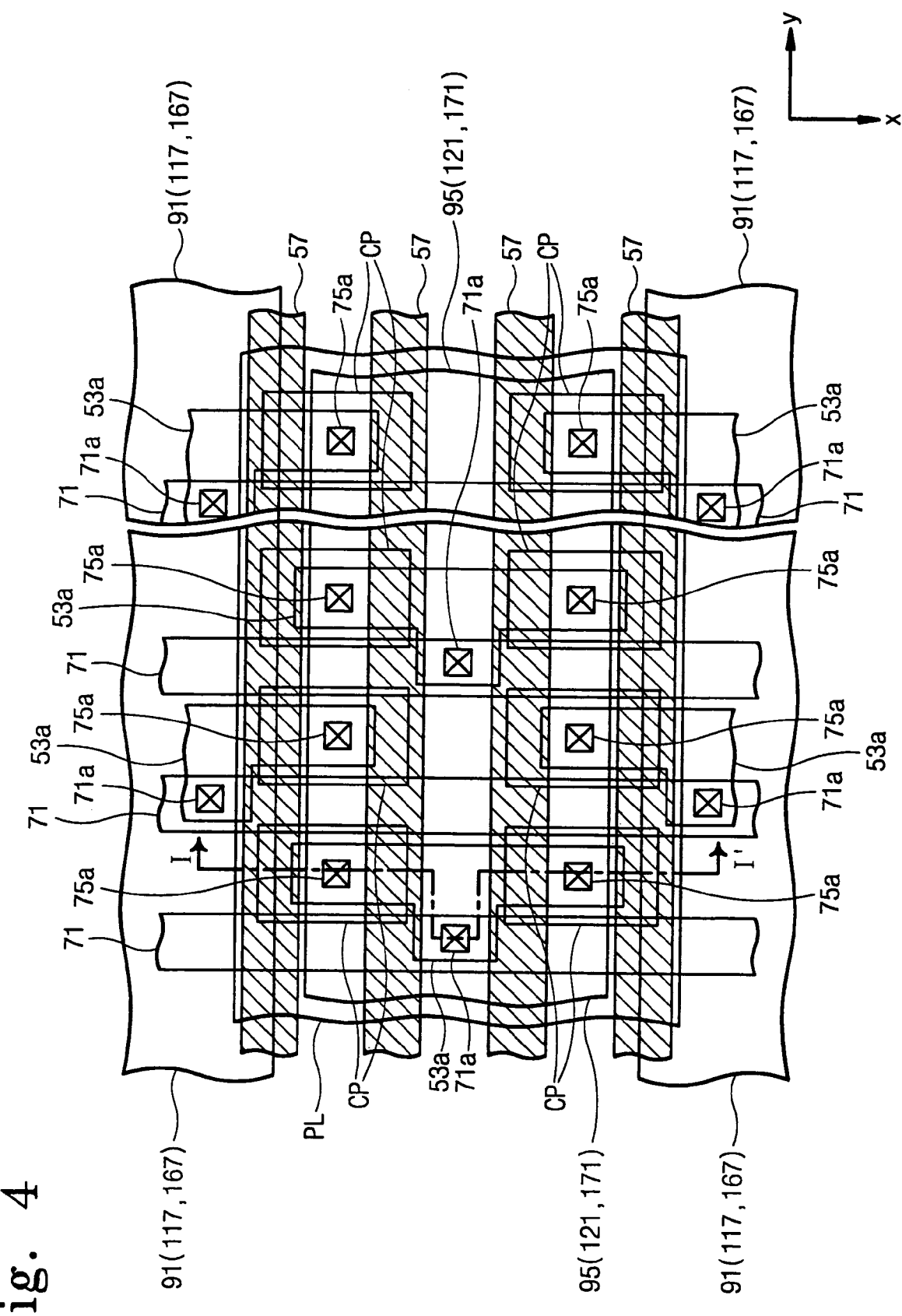
FIG. 4 is a top plan view of a ferroelectric memory device according to embodiments of the present invention.
Figure 5:
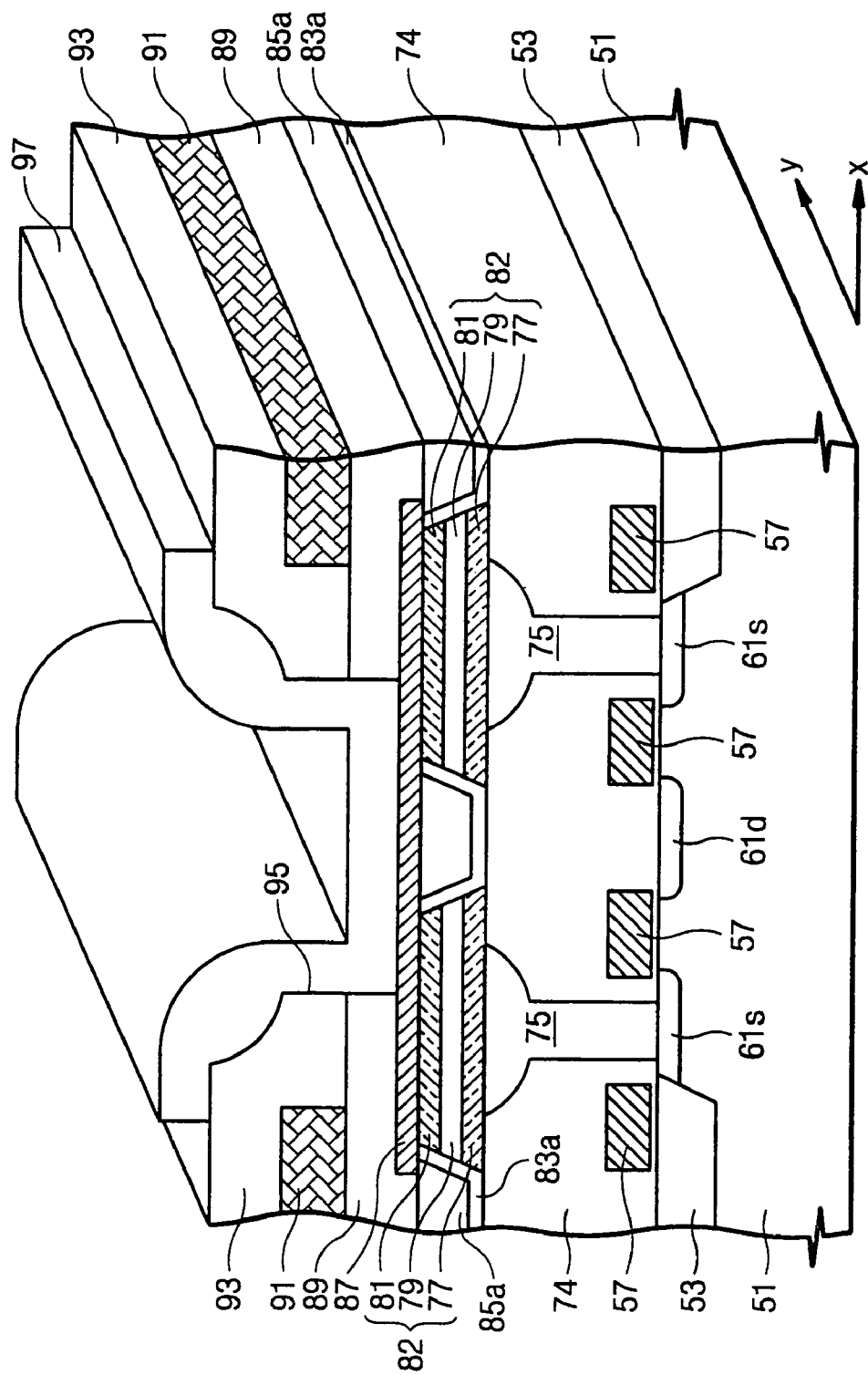
FIG. 5 is a perspective view illustrating a ferroelectric memory device according to some embodiments of the present invention.

Referring now to FIG. 4 and FIG. 5, a device isolation layer 53 is located at a predetermined area of a semiconductor substrate 51 to define a plurality of active regions 53a. A plurality of insulated gate electrodes 57 (i.e., a plurality of word lines) are arranged across the active regions 53a and the device isolation layer 53. The gate electrodes 57 are parallel and extend along a row direction (y-axis). Each of the active regions 53a intersects a couple of gate electrodes 57 to divide each of the active regions 53a into three parts. A common drain region 61d is formed at an active region 53a between the pair of the gate electrodes 57. Source regions 61s are formed at active regions 53a that are located at both sides of the common drain region 61d. Cell transistors are formed at points where the gate electrodes 57 intersect the active regions 53a. The cell transistors are arrayed along a column direction (x-axis) and the row direction (y-axis).

The cell transistors are covered with a lower interlayer insulating layer 74. A plurality of bit lines 71 are arranged in the lower interlayer insulating layer 74, transverse to the word lines 57. The bit lines 71 are electrically connected to the common drain regions 61d through bit line contact holes 71a. The source regions 61s are exposed by storage node contact holes 75a that penetrate the lower interlayer insulating layer 74. Preferably, an upper sidewall of the storage node contact hole 75a has a sloped profile. Each of the storage node contact holes 75a is filled with contact plugs 75. An upper diameter of the contact plug 75 is larger than a lower diameter thereof, as shown in FIG. 5.

A plurality of ferroelectric capacitors 82 (CP shown in FIG. 4) are arrayed along the column direction (x-axis) and the row direction (y-axis). Each of the ferroelectric capacitors 82 includes a bottom electrode 77, a ferroelectric layer pattern 79, and a top electrode 81. Respective ones of the bottom electrodes 77 are located on respective ones of the contact plugs 75. As a result, the bottom electrodes 77 are electrically connected to the source regions 61s through the contact plugs 75. Preferably, gaps between the ferroelectric capacitors 82 are filled with insulating layer patterns 85a.

Preferably, a hydrogen barrier layer pattern 83a is disposed between the insulating layer pattern 85a and at least the ferroelectric layer patterns 79. Preferably, the hydrogen barrier layer pattern 83a is made of titanium oxide ($TiO_2$), aluminum oxide ($Al_2O_3$), silicon nitride ($Si_3N_4$), or a combination thereof. This makes it possible to prevent hydrogen atoms from penetrating into the ferroelectric layer pattern 79. If hydrogen atoms are implanted into the ferroelectric pattern 79, a reliability of the ferroelectric pattern 79 may be degraded. For example, if hydrogen atoms are injected into a ferroelectric layer such as PZT (Pb, Zr, $TiO_3$) layer, oxygen atoms in the PZT layer may react with the hydrogen atoms to cause an oxygen vacancy therein. Owing to the oxygen vacancy, a polarization characteristic of the ferroelectric layer may deteriorate and cause malfunction. If hydrogen atoms are captured in interface traps between the ferroelectric layer pattern and top/bottom electrodes, an energy barrier therebetween may be lowered. Accordingly, leakage current characteristics of the ferroelectric capacitors may be deteriorated.

A plurality of local plate lines 87 (PL shown in FIG. 4) are arranged on the ferroelectric capacitors 82 and the insulating layer pattern 85a. The local plate lines 87 may include a metal, a conductive metal oxide, a conductive metal nitride or a combination thereof. For example, the local plate lines 87 may include titanium aluminum nitride (TiAlN), titanium (Ti), titanium nitride (TiN), iridium (Ir), iridium oxide ($IrO_2$), platinum (Pt), ruthenium (Ru), ruthenium oxide ($RuO_2$), aluminum or combination thereof. The local plate lines 87 extend along the row direction (y-axis). A respective one of the local plate lines 87 covers a respective pair of adjacent rows of ferroelectric capacitors 82. The local plate line 87 directly contacts with the top electrodes 81 of the underlying adjacent rows of capacitors 82. Preferably, the local plate line 87 directly contact the top electrodes 81 of the capacitors 82, which are arrayed in at least two adjacent rows and at least one column. The local plate lines 87 are covered with an upper interlayer insulating layer. The upper interlayer insulating layer may include first and second upper interlayer insulating layers 89 and 93.

Figure 3:
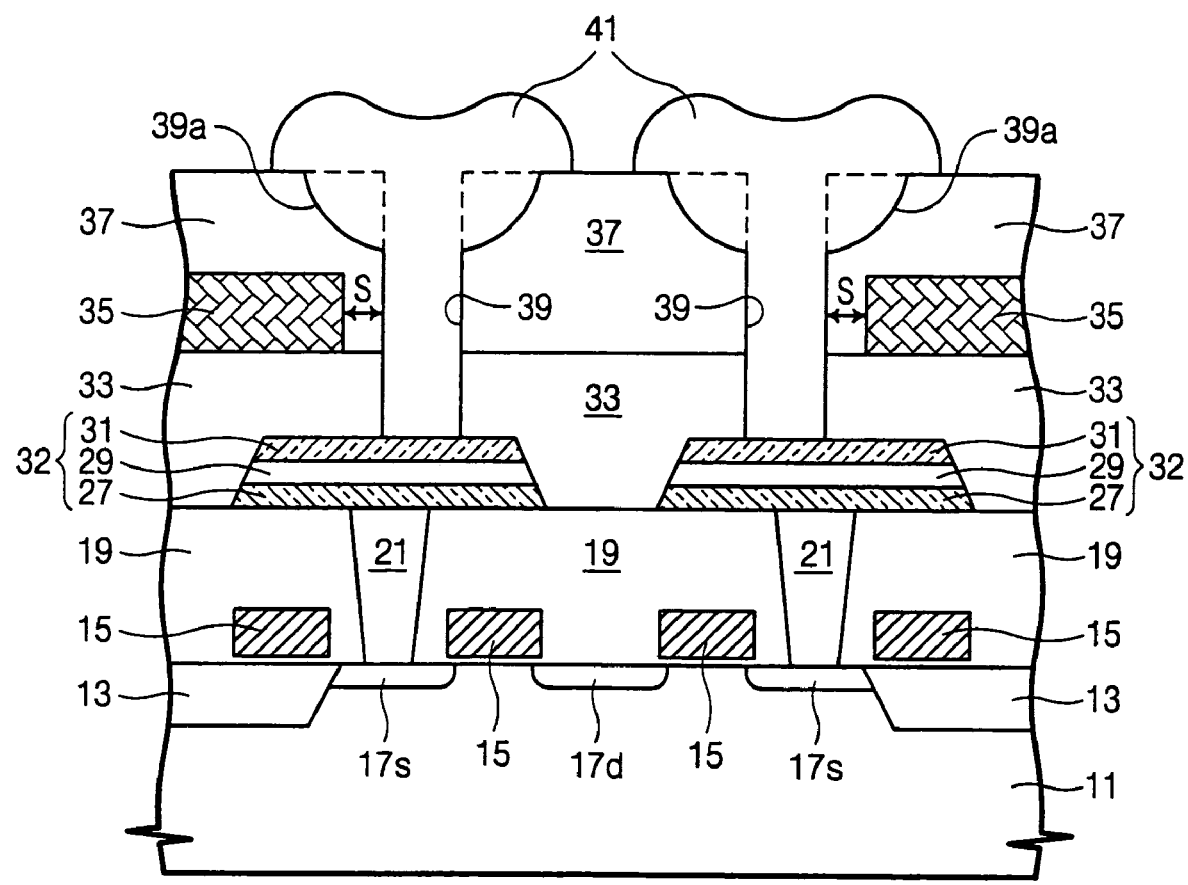

A plurality of main word lines 91 may be disposed between the first and second upper interlayer insulating layers 89 and 93. The main word lines 91 are extended along the row direction (y-axis), thereby being parallel with the local plate lines 87. Generally, each of the main word lines 91 controls four word lines 57 using a decoder. A main plate line 97 may be arranged in the upper interlayer insulating layer between the main word lines 91. The main plate lines 97 are electrically connected to the local plate lines 87 through a slit-type via hole 95 penetrating the upper interlayer insulating layer. The slit-type via hole 95 extends in parallel along the row direction (y-axis) and exposes the local plate line 87. A width of the slit-type via hole 95 is larger than a diameter of the via hole (39 of FIG. 3) of the prior art. The local plate line 87 directly contacts the upper surfaces of the top electrodes 81.

In some embodiments, a plate line may be composed of the local plate line 87 and the main plate line 97. In other embodiments, the plate line may be composed of only the local plate line 87 or only the main plate line 97. In the event that the plate line is composed of only the main plate line 97, the main plate line 97 is in direct contact with the top electrodes 81 of the ferroelectric capacitors, which are arrayed in at least two adjacent rows, through the slit-type via hole 95. Also, if the plate line is composed of only the main plate line 97, the insulating layer pattern 85a is preferably made of material having an etch selectivity with respect to the upper interlayer insulating layer. For example, if the upper interlayer insulating layer is made of silicon oxide, the insulating pattern 85a is preferably made of silicon nitride.

Figure 6:
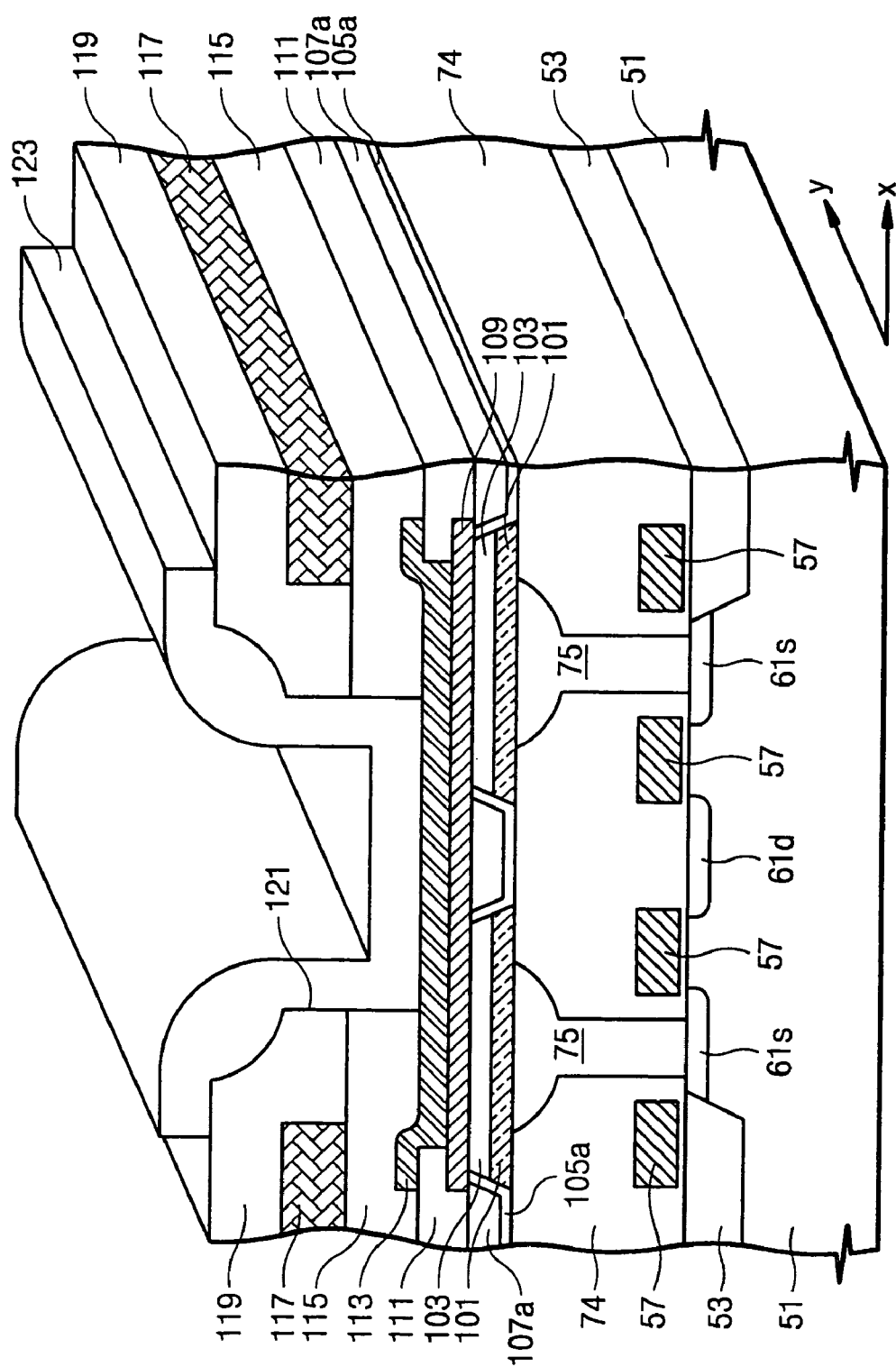
FIG. 6 is a perspective view illustrating a ferroelectric memory device according to further embodiments of the present invention.

A ferroelectric memory device according to second embodiments of the invention is shown in FIG. 6. In these embodiments, cell transistors, a lower interlayer insulating layer, and contact plugs have the same configuration as those in the embodiments of FIG. 5. Further description of these components is therefore omitted in light of the foregoing description.

Referring to FIG. 4 and FIG. 6, a plurality of ferroelectric capacitors covering the contact plugs 75 are located on the lower interlayer insulating layer 74. Therefore, the ferroelectric capacitors are 2-dimensionally arranged along the row and column directions. Each of the ferroelectric capacitors includes a bottom electrode 101, a ferroelectric layer pattern 103, and a common top electrode 109. The common top electrode 109 contacts the ferroelectric layer patterns 103 of the ferroelectric capacitors, which are arrayed in at least two adjacent rows and at least one column. In more detail, the common top electrode 109 is extended to cover ferroelectric layer patterns 103 in adjacent rows. The common top electrode 109 extends along the row direction, similar to the local plate line PL shown in FIG. 4. Preferably, gaps between the ferroelectric patterns 103 and between the bottom electrodes 101 are filled with an insulating layer pattern 107a. Preferably, a hydrogen barrier layer pattern 105a is disposed between the lower insulating layer pattern 107a and at least the ferroelectric layer pattern 103.

The common top electrode 109 is covered with an upper insulating layer 111. The upper insulating layer 111 has a slit-type contact hole that exposes the common top electrode 109. The slit-type contact hole extends along the row direction (y-axis) and is covered with a local plate line 113 (PL shown in FIG. 4). The local plate line 113 is electrically connected to the common top electrode 109 through the slit-type contact hole. Alternatively, a plurality of local plate patterns may be used instead of the single local plate line 113. In this case, each of the local plate patterns is in contact with the common top electrodes 109 of the ferroelectric capacitors, which are arrayed in at least two adjacent rows and at least one column. The local plate line 113 may be composed of the same material layer as the local plate line 87, which is described in the first embodiment of the invention. The local plate line 113 is covered with an upper interlayer insulating layer including first and second upper interlayer insulating layers 115 and 119.

A plurality of main word lines 117 may be disposed between the first and second upper interlayer insulating layers 115 and 119. The main word lines 117 extend in parallel along the row direction. A main plate line 123 may be located in the upper interlayer insulating layer between the main word lines 117. The main plate line 123 is electrically connected to the local plate line 113 through a slit-type via hole 121 that penetrates the upper interlayer insulating layer. The slit-type via hole 121 extends along the row direction (y-axis). Alternatively, the local plate line 113 may be exposed by a plurality of via holes instead of the slit-type via hole 121.

A plate line includes the local plate line 113 and the main plate line 123. Alternatively, the plate line may consist of only the local plate line 113 or only the main plate line 123. In the event that the plate line is composed of only the main plate line 123, the main plate line 123 is in direct contact with the common top electrode 109 of the ferroelectric capacitors, which are arrayed in at least two adjacent rows, through the slit-type via hole 121.

Figure 7:
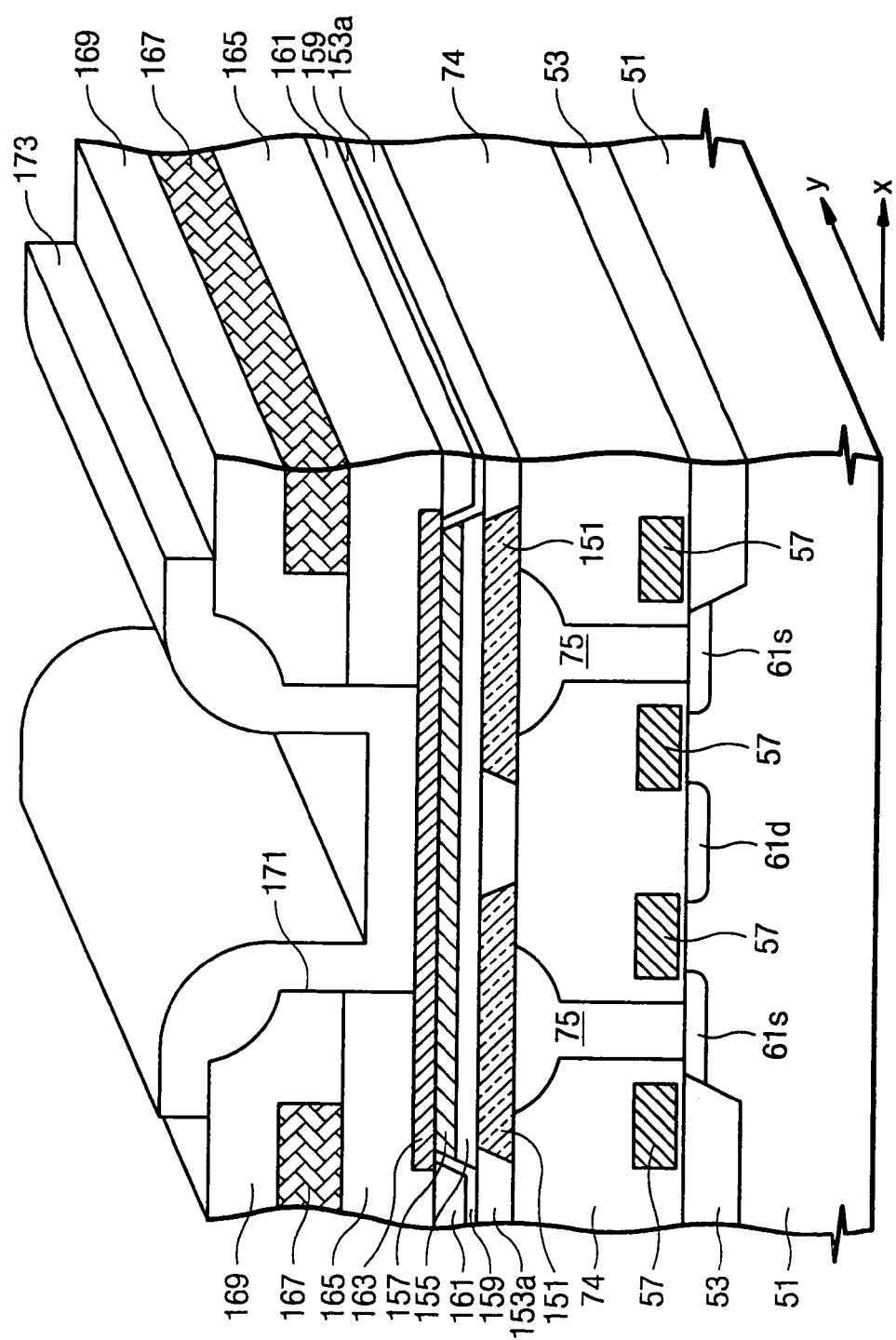
FIG. 7 is a perspective view illustrating a ferroelectric memory device according to still other embodiments of the present invention.

A ferroelectric memory device according to third embodiments of the invention is shown in FIG. 7. In these embodiments, cell transistors, a lower interlayer insulating layer, and contact plugs have the same configuration as those in the embodiments of FIG. 5. Further description of these components will therefore be omitted in light of the foregoing description.

Referring to FIG. 4 and FIG. 7, a plurality of ferroelectric capacitors covering respective ones of the contact pugs 75 is arranged on the lower interlayer insulating layer 74, such that the ferroelectric capacitors are arrayed along row and column directions. Each of the ferroelectric capacitors includes a bottom electrode 151, a common ferroelectric layer pattern 155, and a common top electrode 157. The common ferroelectric layer pattern 155 directly contacts the bottom electrodes 151, which are arrayed in at least two adjacent rows and at least one column. In more detail, the common ferroelectric layer pattern 155 is extended to cover the bottom electrodes 151 of at least two adjacent rows. The common top electrode 157 is stacked on the common ferroelectric layer pattern 155. Therefore, the common ferroelectric pattern 155 and the common top electrode 157 extend along the row direction, similar to the local plates line PL shown in FIG. 4.

Preferably, a gap area between the bottom electrodes 151 is filled with a lower insulating layer pattern 153a, and gap areas between the common ferroelectric layer patterns 155 and between the common top electrodes 157 are filled with a top insulating layer pattern 161. A hydrogen barrier layer pattern 159 may be disposed between the top insulating layer pattern 161 and at least the common ferroelectric layer pattern 155.

A local plate line 163 (e.g., corresponding to the plate line PL shown in FIG. 4) is located on the common top electrode 157. The local plate line 163 is in contact with the common top electrode 157 of the ferroelectric capacitors, which are arrayed in at least two adjacent rows and at least one column. In addition, the local plate line 163 may be extended to be parallel with the row direction (y-axis). The local plate line may include the same material as the local plate line 87 of the embodiment of FIGS. 4 and 5. The local plate line 163 is covered with an upper interlayer insulating layer, which includes first and second upper interlayer insulating layers 165 and 169.

A plurality of main word lines 167 may be disposed between the first and second upper interlayer insulating layers 165 and 169. The main word lines 167 extend in parallel along the row direction. A main plate line 173 may be disposed in the upper interlayer insulating layer between the main word lines 167. The main plate line 173 is electrically connected to the local plate line 163 through a slit-type via hole 171 that penetrates the upper interlayer insulating layer. The slit-type via hole 171 extends along the row direction (y-axis). The local plate line 163 may be exposed by a plurality of via holes instead of the slit-type via hole 171. In this case, each of the via holes exposes the common top electrode 157 of the ferroelectric capacitors, which are arrayed in at least two adjacent rows and at least one column.

A plate line includes the local plate line 163 and the main plate line 173. Alternatively, the plate line may consist of only the local plate line 163 or only the main plate line 173. In embodiments in which the plate line is composed of only the main plate line 173, the main plate line 173 is in direct contact with the common top electrode 157 of the ferroelectric capacitors, which are arrayed in at least two adjacent rows, through the slit-type via hole 171.

A method of fabricating a ferroelectric memory device according to some embodiments of the present invention will now be described more fully hereinafter with reference to FIG. 8 through FIG. 14.

Figure 8:
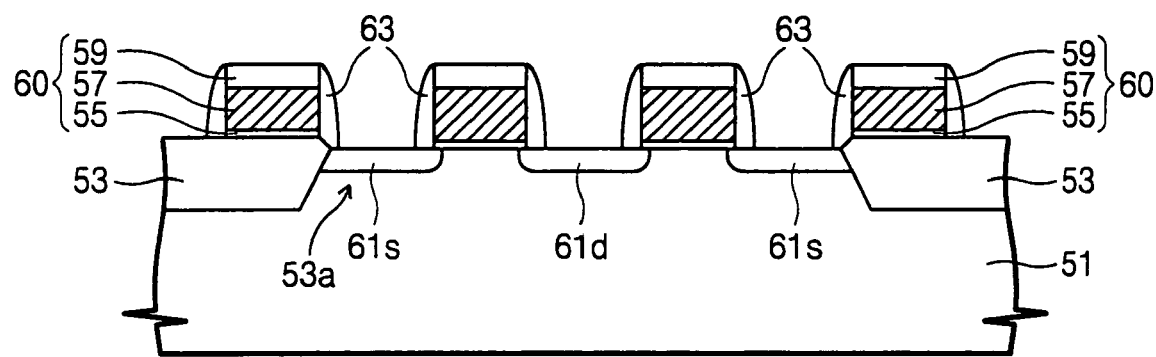
FIGS. 8-14 are cross-sectional views of intermediate fabrication products illustrating operations for fabricating a ferroelectric memory device according to some embodiments of the present invention.

Referring now to FIG. 8, a device isolation layer 53 is formed in a predetermined area of a semiconductor substrate 51 to define a plurality of active regions 53*a*. A gate insulating layer, a gate conductive layer, and a capping insulating layer are sequentially formed on the semiconductor substrate 51. The capping insulating layer, the gate conductive layer, and the gate insulating layer are successively patterned to form a plurality of gate patterns 60 crossing over the active regions 53*a* and the device isolation layer 53. Each of the gate patterns 60 includes a gate insulating layer pattern 55, a gate electrode 57, and a capping insulating layer pattern 59. Preferably, the gate patterns 60 are formed along the row direction (y-axis of FIG. 4).

Using the gate patterns 60 and the device isolation layer 53 as ion implantation masks, impurities are implanted into the active regions to form three impurity regions in each of the active regions. A central impurity region corresponds to a common drain region 61*d*, and the other regions correspond to source regions 61*s*. Therefore, a couple of cell transistors are formed in each of the active regions. The cell transistors are arrayed on the semiconductor substrate 51 along row and column directions. Then, a spacer 63 is formed on a sidewall of the gate pattern 60 using, for example, conventional processes.

Figure 9:
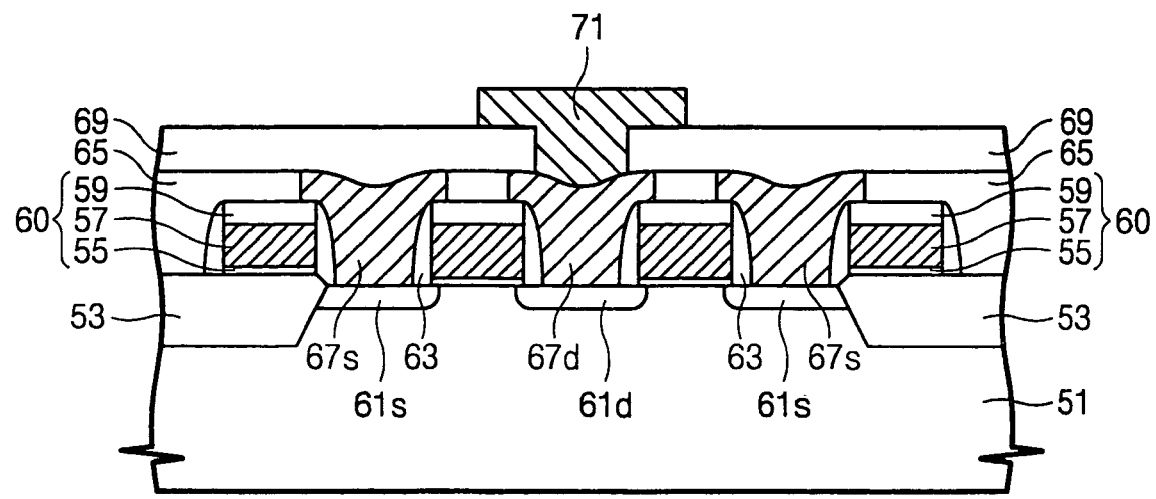

Referring now to FIG. 9, a first lower interlayer insulating layer 65 is formed on the semiconductor substrate. The first lower interlayer insulating layer 65 is patterned to form pad contact holes exposing the source/drain regions 61*s* and 61*d*. A conventional technique may be used to form storage node pads 67*s* and bit line pads 67*d* in the pad contact holes. The storage node pads 67*s* are connected to the source regions 61*s*, and the bit line pad 67*d* is connected to the common drain region 61*d*. A second lower interlayer insulating layer 69 is formed on the pads 67*s* and 67*d*. The second lower interlayer insulating layer 69 is patterned to form a bit line contact hole (71*a* shown in FIG. 4) exposing the bit line pad 67*d*. A bit line 71 is formed, contacting the bit line pad 67*d*.

Figure 10:
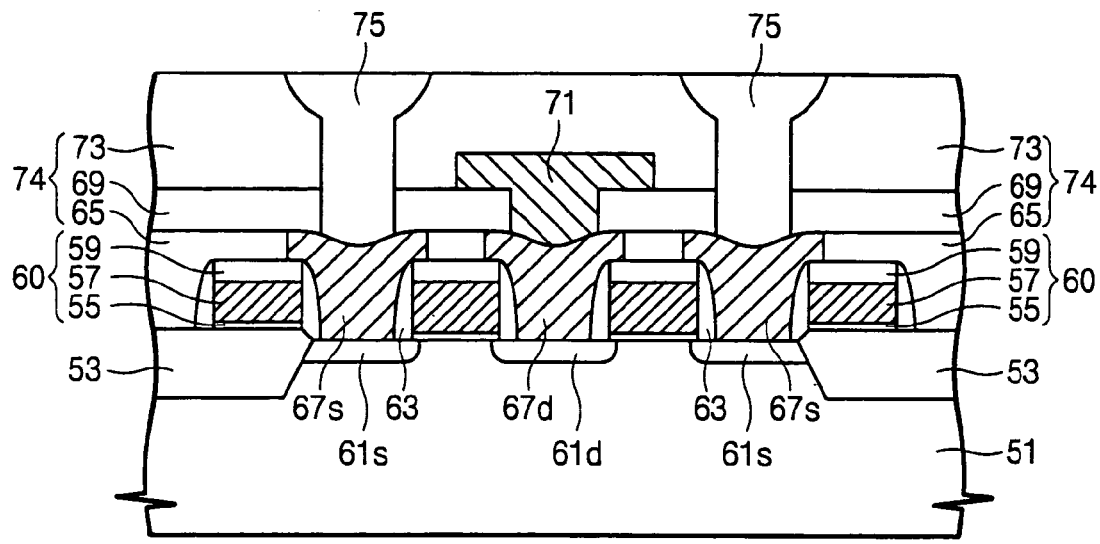

Referring now to FIG. 10, a third lower interlayer insulating layer 73 is formed on the bit line 71. The second and third lower interlayer insulating layers 69 and 73 are patterned to form storage node contact holes (75*a* shown in FIG. 4) exposing the storage node pads 67*s*. The storage node contact hole may be formed by a wet and/or dry etch process to increase an upper diameter thereof. Accordingly, an upper sidewall of the storage node contact hole may have a sloped profile, as shown in the drawing. This is aimed at decreasing in an electrical resistance between a lower electrode, formed in a subsequent process, and the source region 61*s*. Contact plugs 75 are formed in the storage node contact holes.

Figure 11:
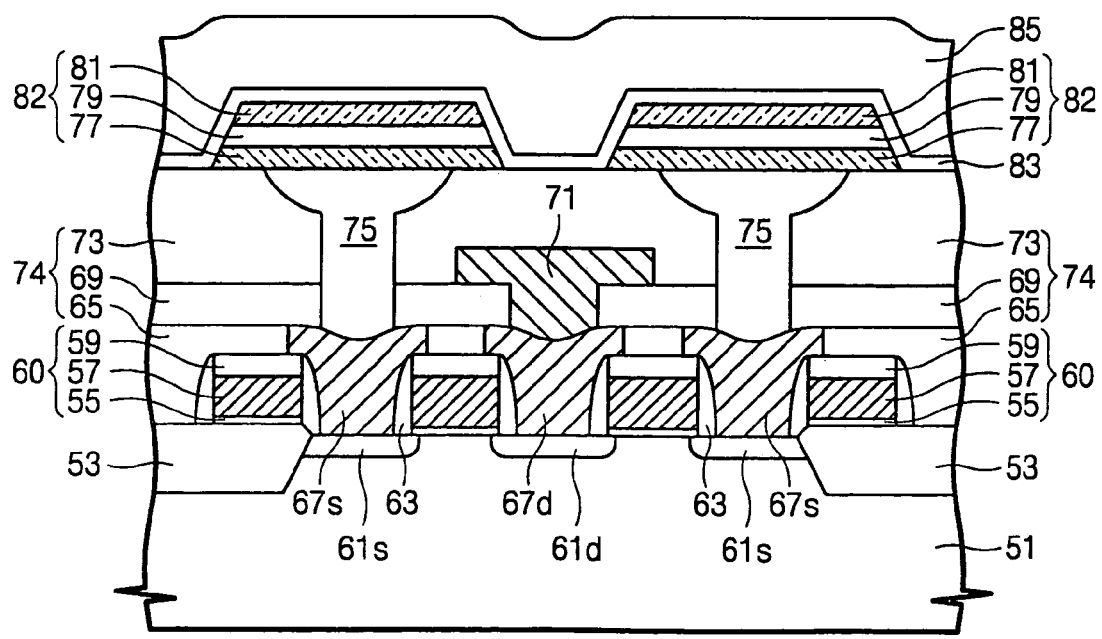

Referring now to FIG. 11, a conductive bottom electrode layer, a ferroelectric layer, and a conductive top electrode layer are sequentially formed on the contact plugs 75 and the lower interlayer insulating layer 74. The top electrode layer, the ferroelectric layer, and the bottom electrode layer are successively patterned to form a plurality of ferroelectric capacitors 82 (CP shown in FIG. 4) that are arrayed along row and column directions. Each of the ferroelectric capacitors 82 includes a bottom electrode 77, a ferroelectric layer pattern 79, and a top electrode 81. Respective ones of the bottom electrodes 77 are in contact with respective ones of the contact plugs 75. Thus, respective ones of the ferroelectric capacitors 82 are electrically connected to respective ones of the source regions 61*s*. An insulating layer 85 is formed on the resultant structure. Prior to formation of the insulating layer 85, a conformal hydrogen barrier layer 83 may be formed. Preferably, the hydrogen barrier layer 83 is made of titanium oxide ($TiO_2$), aluminum oxide ($Al_2O_3$), silicon nitride ($Si_3N_4$), or combination thereof.

Figure 12:
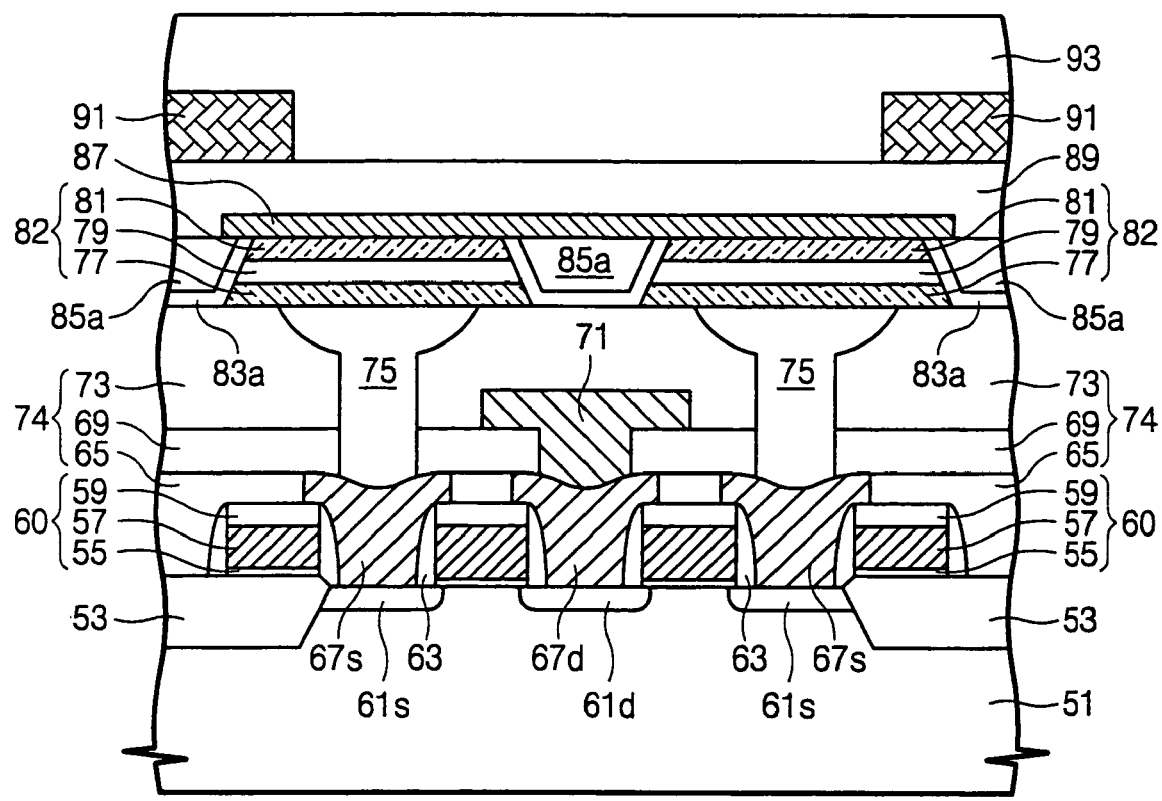

Referring now to FIG. 12, the insulating layer 85 and the hydrogen barrier layer 83 are planarized to expose the top electrodes 81. The planarization process can be performed using, for example, a chemical mechanical polishing (CMP) technique or an etch-back technique. Thus, a hydrogen barrier layer pattern 83*a* and an insulating layer pattern 85*a* are formed between the ferroelectric capacitors 82. The hydrogen barrier layer pattern 83*a* covers sidewalls of the ferroelectric capacitors 82 (i.e., sidewalls of the ferroelectric layer patterns 79), thereby preventing hydrogen atoms from being injected into the ferroelectric layer patterns 79. If hydrogen atoms are injected into the ferroelectric layer patterns 79, characteristics of ferroelectric capacitors 82, such as a polarization characteristic or a leakage current characteristic, may be deteriorated. As a result, the hydrogen barrier layer pattern 83*a* can improve characteristics of the ferroelectric capacitors 82.

A conductive lower plate layer is formed on an entire surface of the semiconductor substrate including the insulating layer pattern 85*a*. The conductive lower plate layer may be formed of a metal, a conductive metal oxide, a conductive metal nitride or a combination thereof. For example, the conductive lower plate layer can be formed of titanium aluminum nitride (TiAlN), titanium (Ti), titanium nitride (TiN), iridium (Ir), iridium oxide ($IrO_2$), platinum (Pt), ruthenium (Ru), ruthenium oxide ($RuO_2$), aluminum or combination thereof. The conductive lower plate layer is patterned to form local plate line 87 (PL shown in FIG. 4) that extends parallel with the word lines 57 which is perpendicular to the bit line 71. The local plate line 87 directly contacts the top electrodes 81 of the ferroelectric capacitors 82 which are arrayed in two adjacent rows. An upper interlayer insulating layer is formed on the local plate line 87. The upper interlayer insulating layer is formed by sequentially stacking first and second upper interlayer insulating layers 89 and 93. Prior to formation of the second upper interlayer insulating layer 93, a plurality of parallel main word lines 91 may be formed on the first upper interlayer insulating layer 89. The main word lines are parallel to the row direction (y-axis of FIG. 4). One main word line 91 may control four word lines 57 through a decoder.

Figure 13:
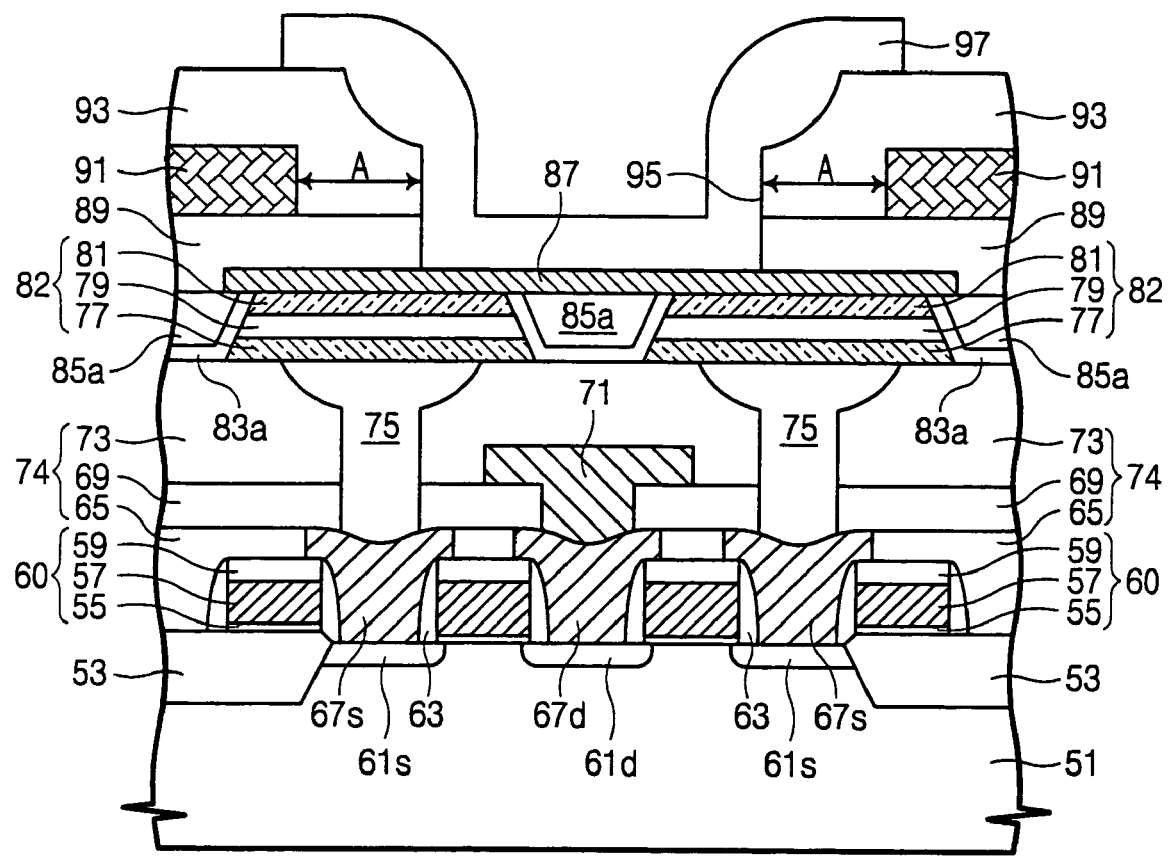

Referring now to FIG. 13, the upper interlayer insulating layer is patterned to form a slit-type via hole 95 exposing the local plate line 87. The slit-type via hole 95 is formed between the main word lines 91, in parallel with the main word lines 91. A plurality of via holes may be formed instead of the slit-type via hole 95, each of the via holes exposing the local plate line 87 on the ferroelectric capacitors, which are arrayed in at least two adjacent rows and at least one column. Compared with a prior art, the slit-type via hole 95 has greater width, as shown in the drawing. Nevertheless, a spacing (A) between the slit-type via hole 95 and the adjacent main word lines 91 can be greater, compared with the prior art. This can lead to a significant decrease in the probability that the word lines 91 will be exposed, even though the slit-type via hole 95 is formed by wet and/or dry etch in order to lower an aspect ratio thereof.

A conductive upper plate layer, such as a metal layer comprising aluminum, is formed on the resultant structure, passing through the slit-type via hole 95 to contact the local plate line 87. The upper plate layer may exhibit good step coverage because the aspect ratio of the slit-type via hole 95 may be kept relatively low. The upper plate layer is patterned to form a main plate line 97. The main plate line 97 is formed to be parallel to the row direction (y-axis). The main plate line 97 is electrically connected to the ferroelectric capacitors, which are arrayed in at least two adjacent rows, through the local plate line 87.

Figure 14:
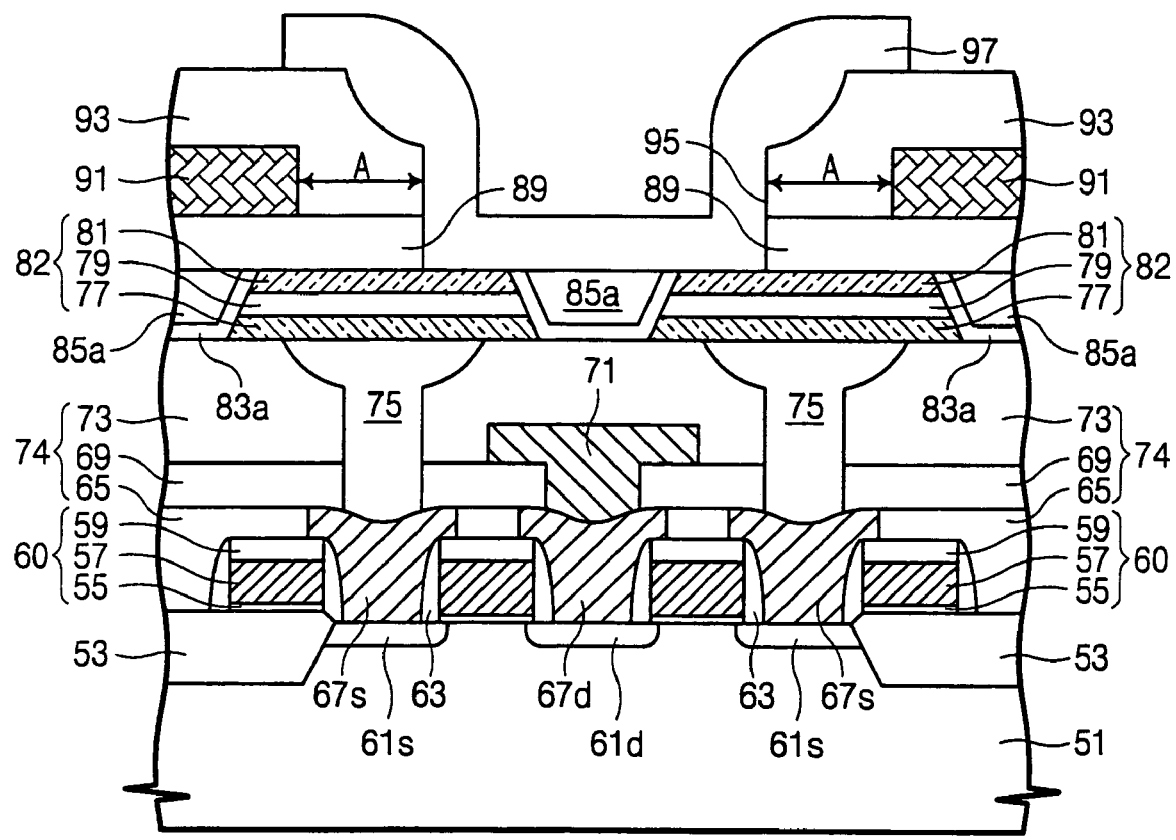

Modifications of the embodiments described in FIGS. 8-13 will now be described with reference to FIG. 14. These modified embodiments differ in the manner in which local plate lines 87 are formed. In the modified embodiments, not only the top electrodes 81, but also the insulating layer pattern 85a therebetween, are exposed during formation of the slit-type via hole 95. Accordingly, the insulating layer pattern 85a is preferably made of material (e.g., silicon nitride) having an etch selectivity with respect to the upper interlayer insulating layer. The main plate line 97 is in direct contact with the top electrodes 81 of the ferroelectric capacitors, which are arrayed in at least two adjacent rows.

Operations for fabricating a ferroelectric memory device according to additional embodiments of the invention will now be described with reference to FIG. 15 through FIG. 19. In these embodiments, cell transistors, a lower interlayer insulating layer, and contact plugs can be formed in the same manner as the embodiments described in FIGS. 8-13.

Figure 15:
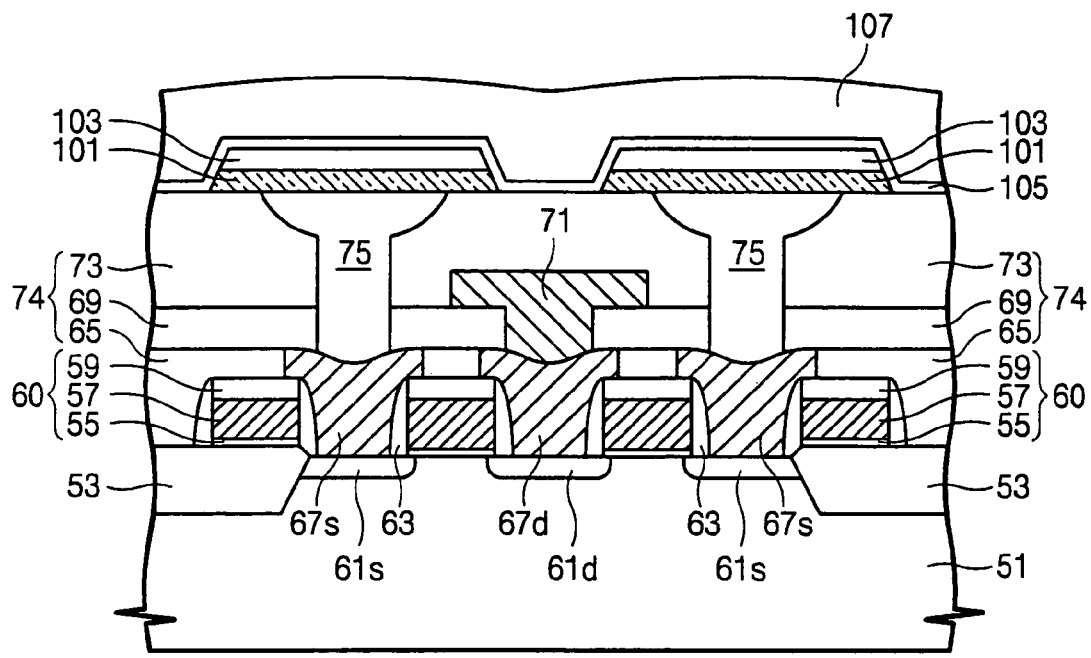
FIGS. 15-19 are cross-sectional views of intermediate fabrication products illustrating operations for fabricating a ferroelectric memory device according to other embodiments of the present invention.

Referring now to FIG. 15, a conductive bottom electrode layer and a ferroelectric layer are sequentially formed on the lower interlayer insulating layer 74 and the contact plugs 75. The ferroelectric layer and the bottom electrode layer are successively patterned to form a plurality of bottom electrodes 101 covering the contact plugs 75, and a plurality of ferroelectric layer patterns 103 stacked on the bottom electrodes 101. A hydrogen barrier layer 105 and a lower insulating layer 107 are sequentially formed on the ferroelectric layer patterns 103.

Figure 16:
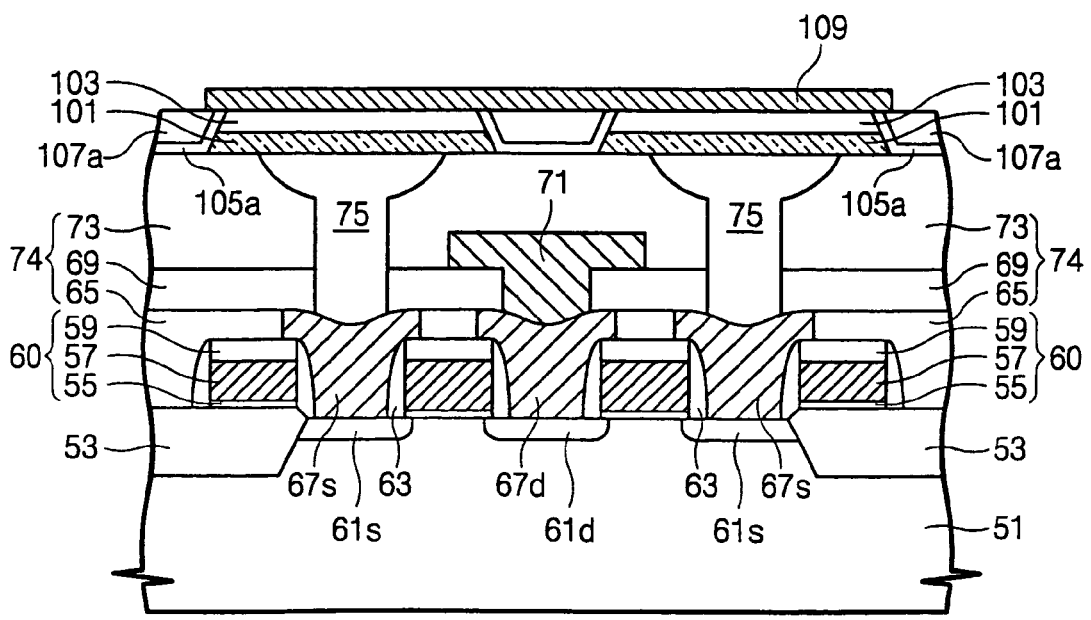

Referring now to FIG. 16, the lower insulating layer 107 and the hydrogen barrier layer 105 are planarized to expose the ferroelectric layer patterns 103. Thus, a lower insulating layer pattern 107a and a hydrogen barrier layer pattern 105a are formed in gaps between the ferroelectric layer patterns 103 and between the bottom electrodes 101. A conductive top electrode layer is formed on the lower insulating layer pattern 107a, the hydrogen barrier layer pattern 105a, and the ferroelectric layer patterns 103. The top electrode layer is patterned to form a common top electrode 109 that extends parallel to the word lines 57. The common top electrode 109 covers the ferroelectric layer patterns 103. In other words, the common top electrode 109 directly contacts the ferroelectric layer patterns 103 of the ferroelectric capacitors, which are arrayed in at least two adjacent and at least one column.

Figure 17:
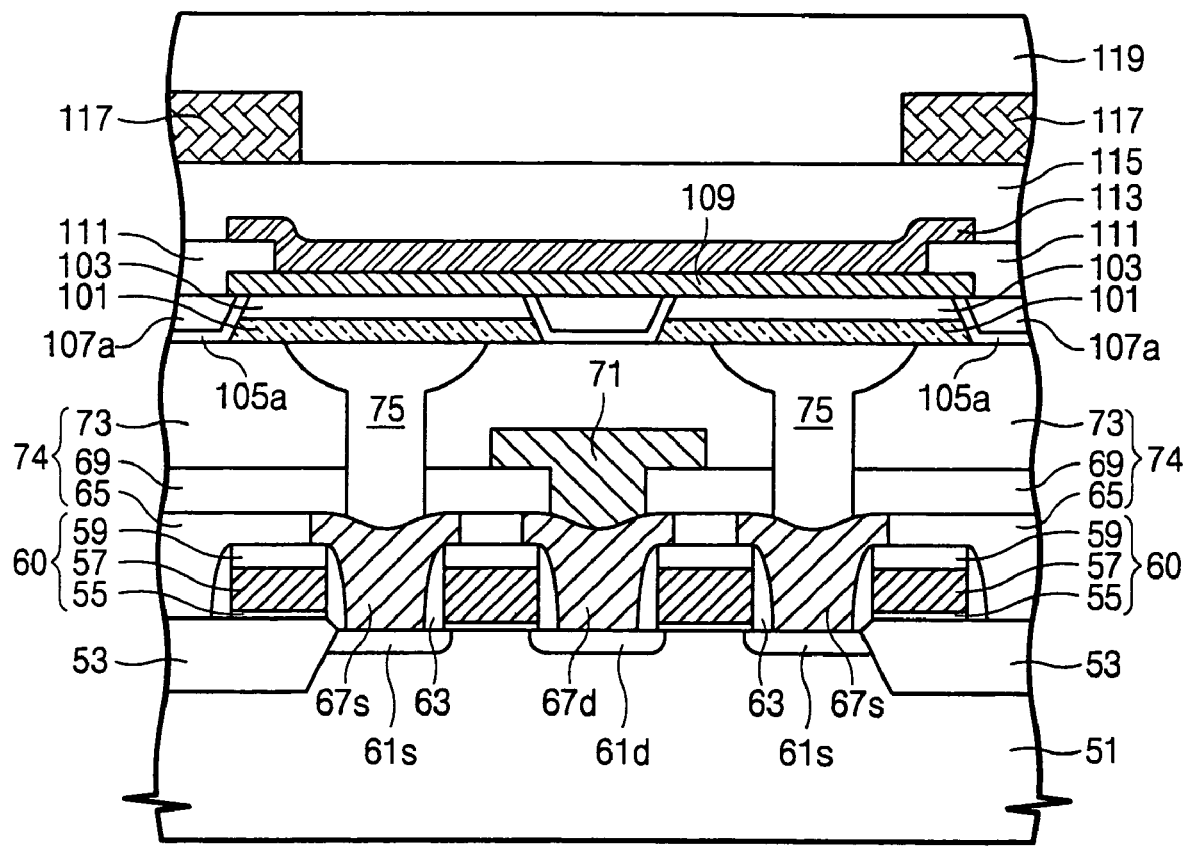
Figure 18:
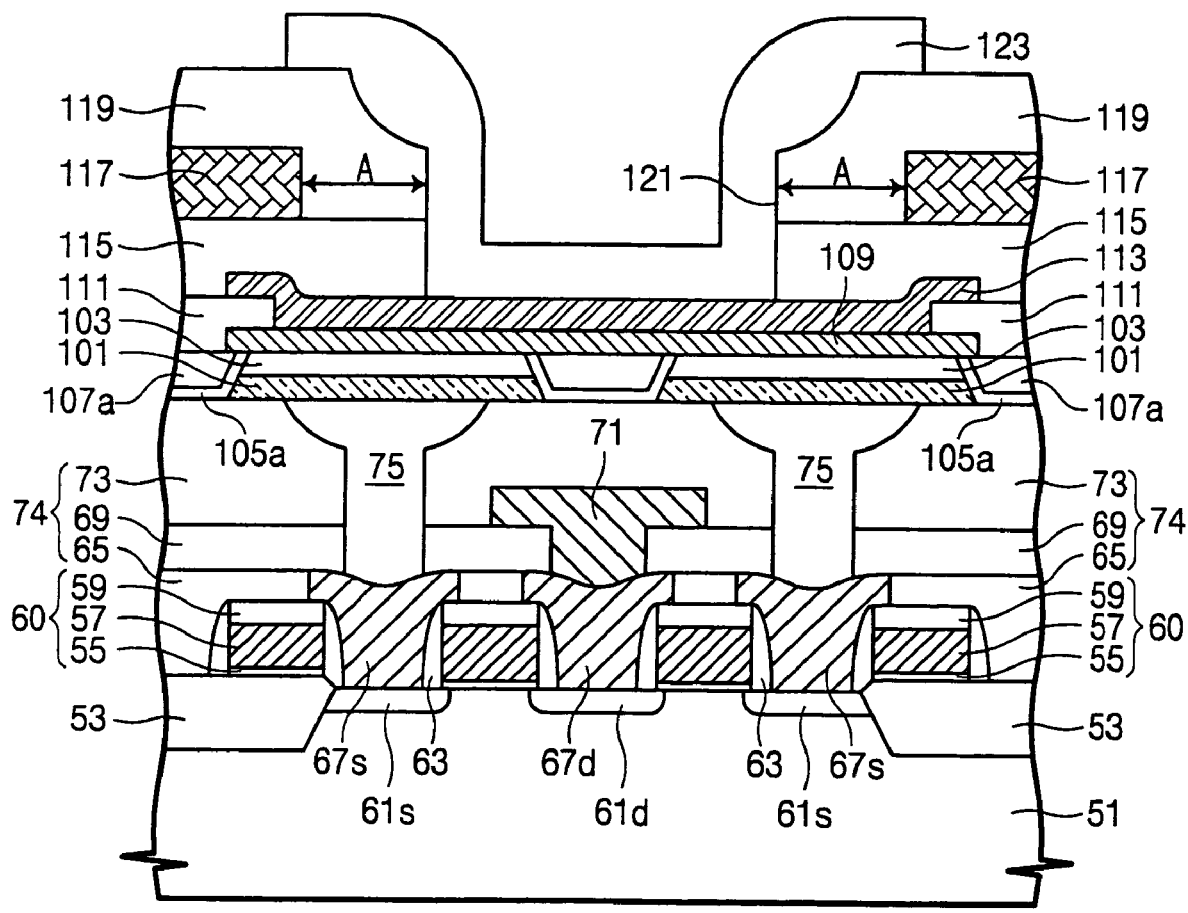

Referring now to FIG. 17, an upper insulating layer 111 is formed on the common top electrode 109. The upper insulating layer 111 is patterned to form a slit-type contact hole exposing the common top electrode 109. The processes for forming the upper insulating layer 111 and the slit-type contact hole may be omitted. A conductive lower plate layer is formed, contacting the common top electrode 109 through the slit-type contact hole. The conductive lower plate layer is formed of the same material layer as the conductive lower plate layer which is described with respect to the embodiments of FIGS. 4 and 5. The lower plate layer is patterned to form a local plate line 113 (PL shown in FIG. 4). First and second upper interlayer insulating layers 113 and 119 are sequentially formed on the local plate line. A plurality of main word lines 117 may be formed between the first and second interlayer insulating layers 113 and 119. The main word lines 117 are formed in the same manner as in the previously described embodiments. Referring to FIG. 18, a slit-type via hole 121 is formed in the upper interlayer insulating layer. A main plate line 123 is then formed as previously described.

Figure 19:
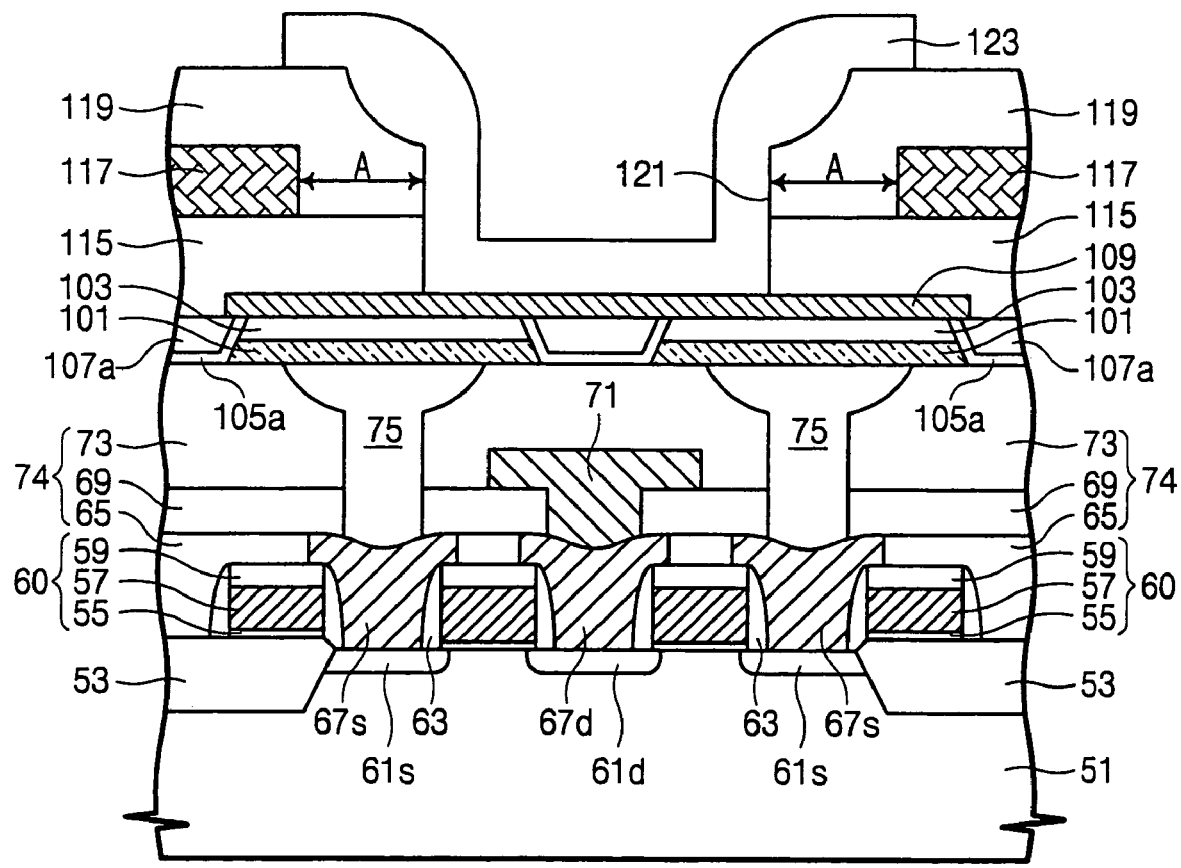

Modifications of the embodiments described in FIGS. 15-18 will now be described with reference to FIG. 19. The modified embodiments are identical to the embodiments of FIGS. 15-18, except that the local plate line 115 is not formed. In this case, the slit-type via hole 121 exposes the common top electrode 109.

A method of fabricating a ferroelectric memory device according to further embodiments of the invention will now be described with reference to FIG. 20 through FIG. 24. In these embodiments, cell transistors, a lower interlayer insulating layer, and contact plugs are formed in the same manner as in the previously described embodiments.

Figure 20:
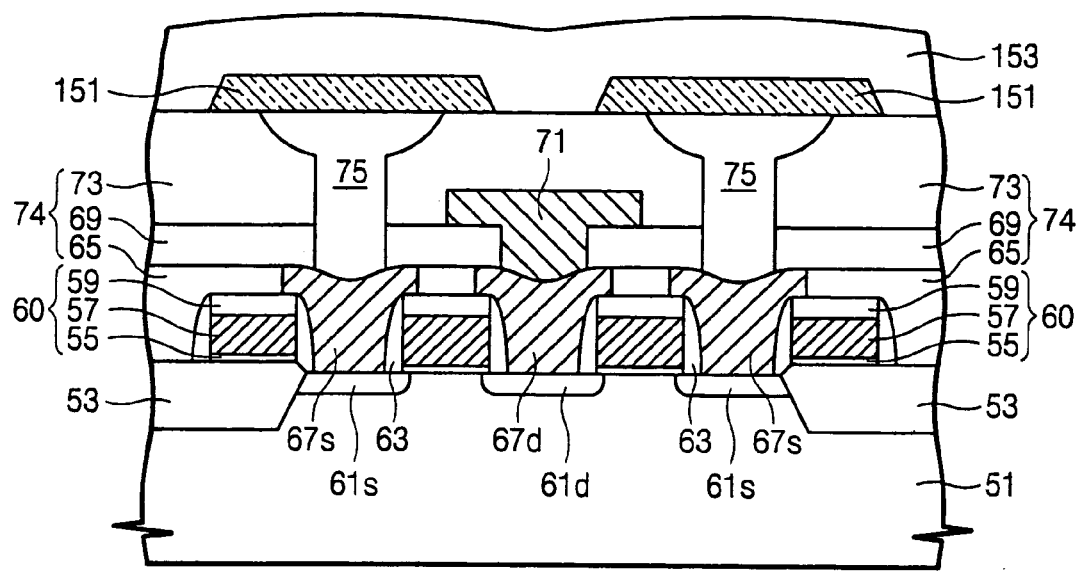
FIGS. 20-24 are cross-sectional views of intermediate fabrication products illustrating operations for fabricating a ferroelectric memory device according to further embodiments of the present invention.

Referring now to FIG. 20, a conductive bottom electrode layer is formed on the lower interlayer insulating layer 74 and the contact plugs 75. The bottom electrode layer is patterned to form a plurality of bottom electrodes 151 covering the contact plugs 75. A lower insulating layer 153 is formed on the bottom electrodes 151.

Figure 21:
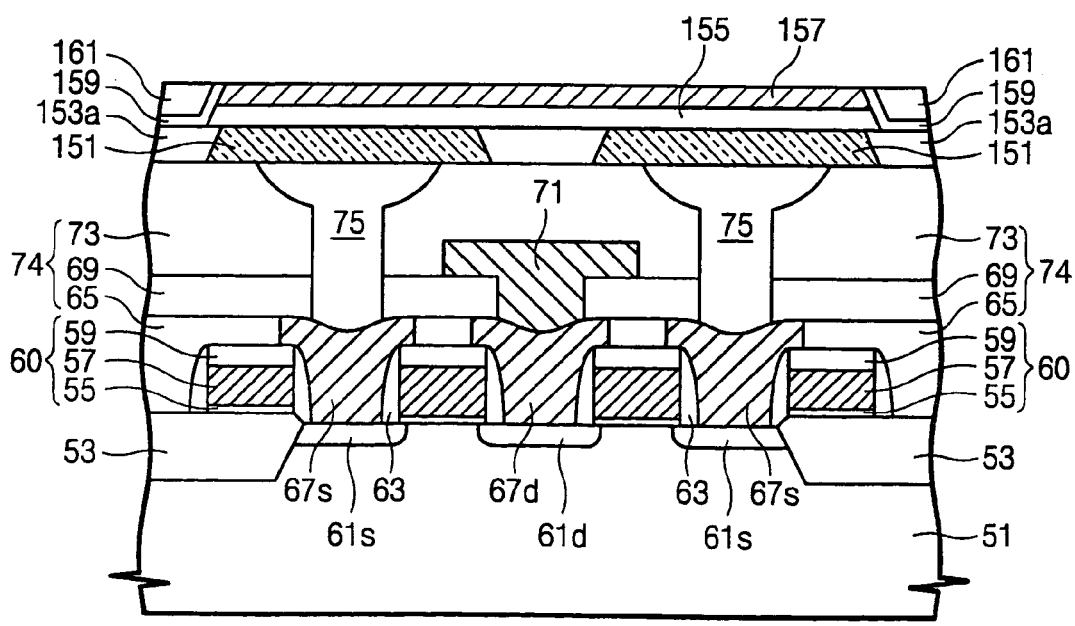

Referring now to FIG. 21, the lower insulating layer 153 is planarized to expose upper surfaces of the bottom electrodes 151, thus forming an insulating layer pattern 153a in a gap between the bottom electrodes 151. A ferroelectric layer and a conductive top electrode layer are sequentially formed on the lower insulating layer pattern 153a and the bottom electrodes 151. The upper electrode layer and the ferroelectric layer are successively patterned to form a common ferroelectric layer pattern 155 and a common top electrode 157. The common ferroelectric layer pattern 155 covers the bottom electrodes 151, which are arrayed in at least two adjacent rows and at least one column. Further, the common ferroelectric layer pattern 155 may be extended and formed to be parallel to the row direction (y-axis). A hydrogen barrier layer pattern 159 and an upper insulating layer pattern 161 are formed in gaps adjacent the common ferroelectric pattern 155 and the common top electrode 157.

Figure 22:
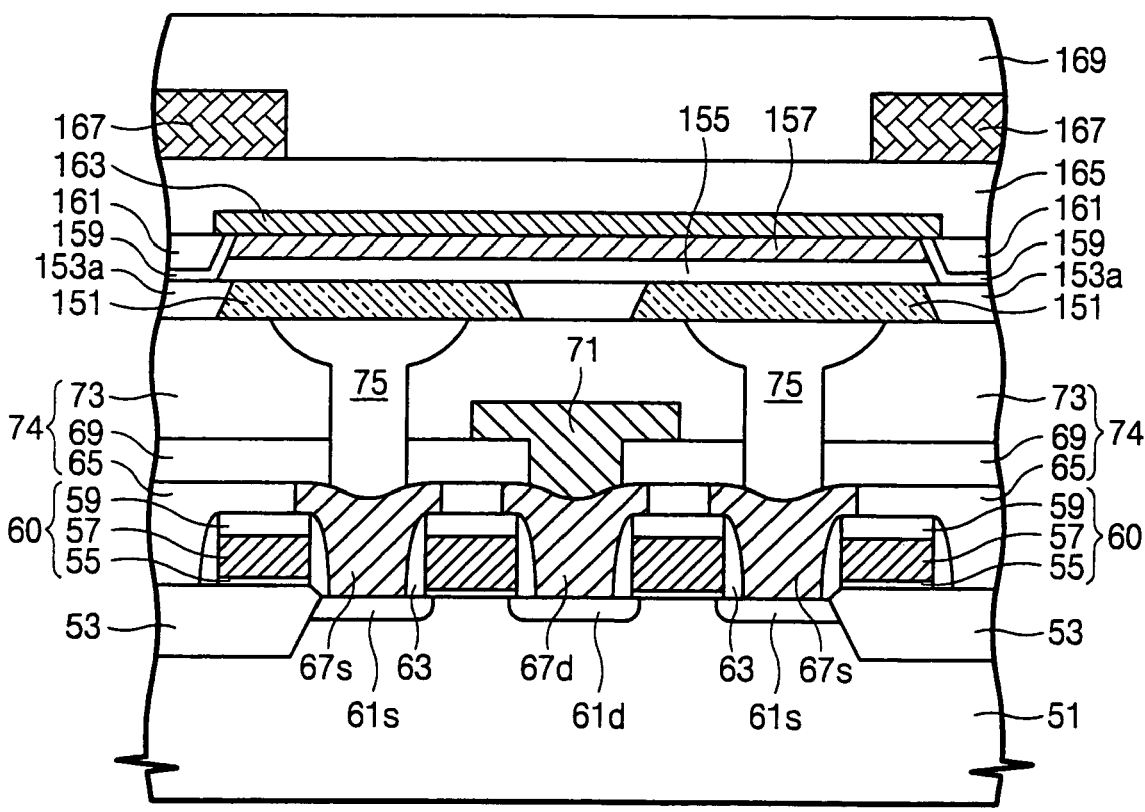

Referring now to FIG. 22, a conductive lower plate layer is formed on the upper insulating layer pattern 161 and the common top electrode 157. The lower plate layer may include the same material as the lower plate electrode described with reference to the embodiments of FIGS. 4 and 5. The lower plate layer is patterned to form a local plate line 163 (PL shown in FIG. 4) covering the common top electrode 157. As a result, the local plate line 163 is in contact with the common top electrode 157 of the ferroelectric capacitors, which are arrayed in at least two adjacent rows. Preferably, the local plate line 163 is in direct contact with the common top electrode 157 of the ferroelectric capacitors, which are arrayed in at least two adjacent rows and at least one column.

An upper interlayer insulating layer is formed on the local plate line 163. The upper interlayer insulating layer is formed by sequentially stacking first and second upper interlayer insulating layers 165 and 169. A plurality of parallel main word lines 167 may be formed between the first and second upper interlayer insulating layers 165 and 169. The main word lines 167 may be formed as in previously described embodiments.

Figure 23:
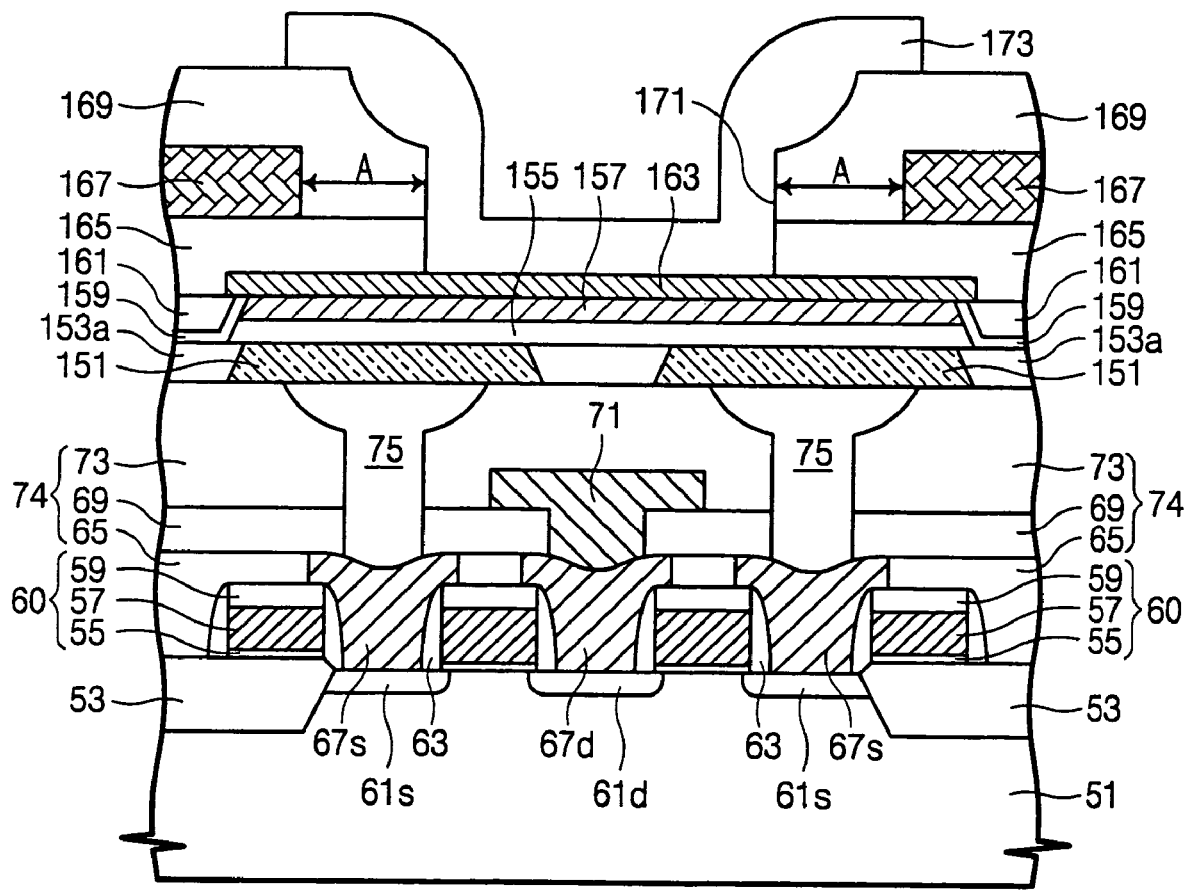

Referring now to FIG. 23, a slit-type via hole 171 is formed in the upper interlayer insulating layer. A conductive main plate line 173 is formed, extending through the slit-type via hole 171. The slit-type via hole 171 and the main plate line 173 may be formed as in the previously described embodiments.

Figure 24:
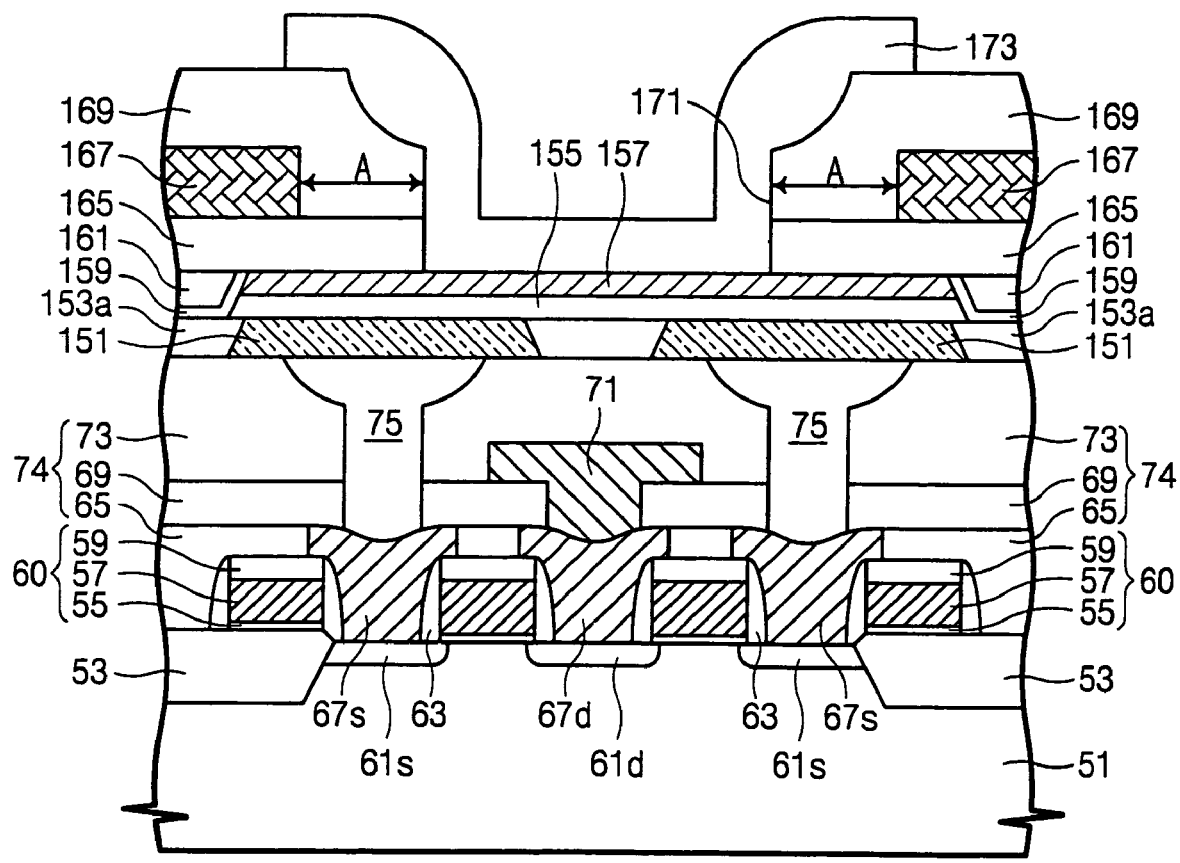

A modification of the embodiments of FIGS. 20-23 will now be described with reference to FIG. 24. The modified embodiments are identical to the embodiments of FIGS. 20-23 except that the local plate line 163 is omitted. In this case, the slit-type via hole 171 exposes the common top electrode 157.

Figure 25:
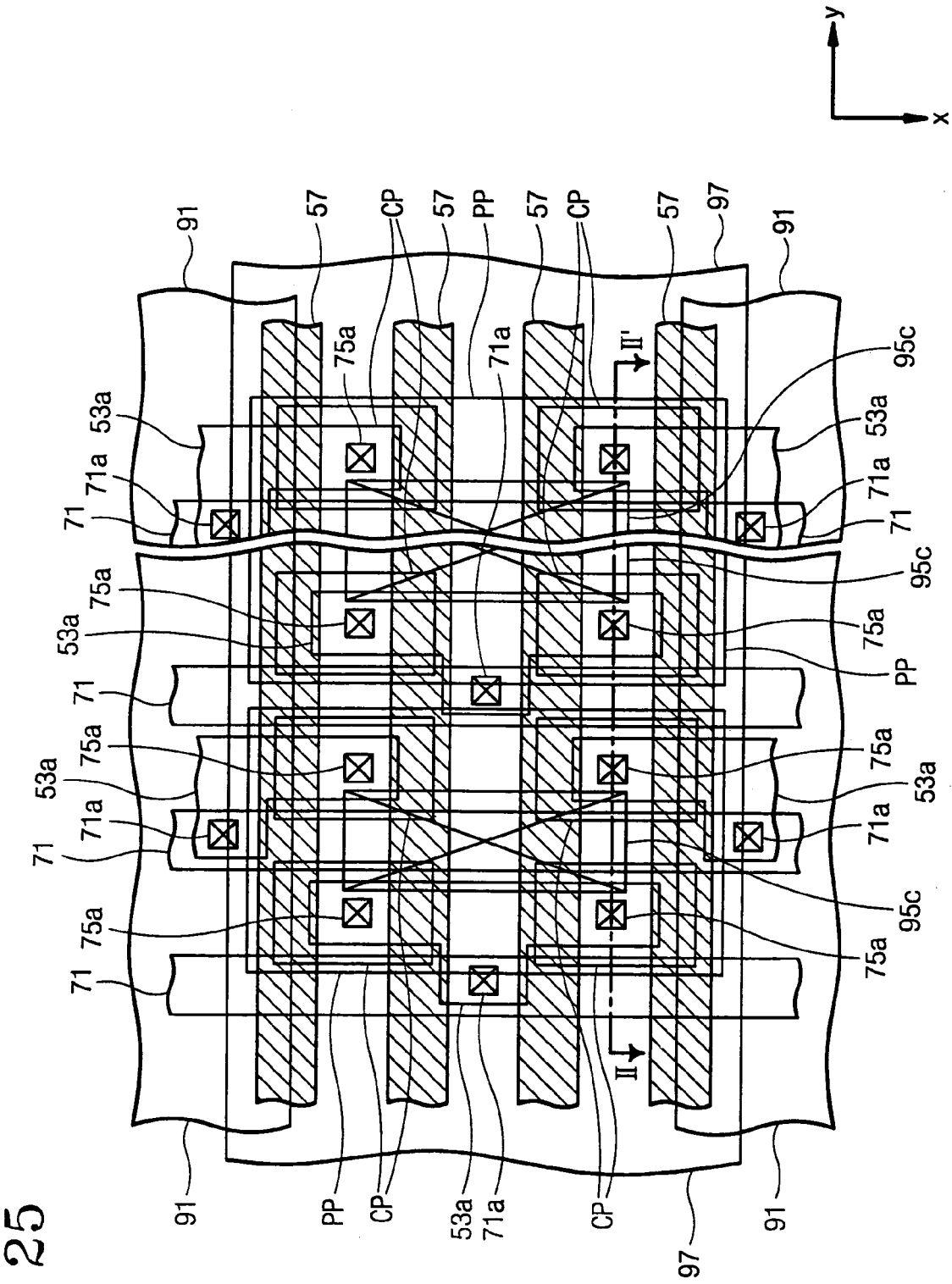
FIG. 25 is a plan view of a ferroelectric memory device according to further embodiments of the present invention.
Figure 26:
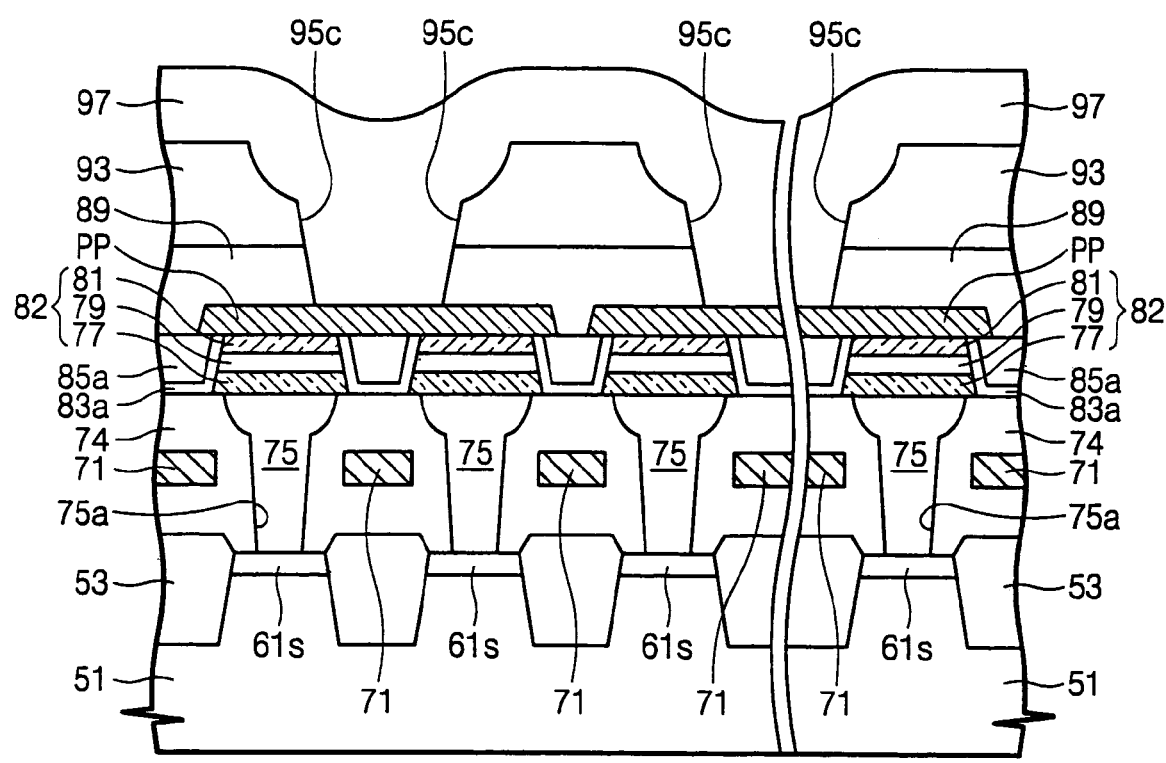
FIG. 26 is a cross-sectional view illustrating a ferroelectric memory device and fabrication operations therefor according to additional embodiments of the present invention.

FIG. 25 is a top plan view showing a modification of the embodiments of the invention shown in FIG. 4, and FIG. 26 is a cross-sectional view for illustrating a ferroelectric memory device and a method of fabricating the same, taken along the line II-II' of FIG. 25. In these embodiments, cell transistors, lower interlayer insulating layer, contact plugs, ferroelectric capacitors and insulating layer patterns have the same configurations as those in the embodiments of FIG. 5 and can be formed in the same manner as the embodiments described in FIGS. 8-11. Accordingly, further description of these components is omitted in light of foregoing description.

Referring to FIGS. 25 and 26, a plurality of local plate patterns PP are disposed on the ferroelectric capacitors 82 and the insulating layer pattern 85a. The local plate patterns PP may include a metal, a conductive metal oxide, a conductive metal nitride or a combination thereof. For example, the local plate patterns PP may include titanium aluminum nitride (TiAlN), titanium (Ti), titanium nitride (TiN), iridium (Ir), iridium oxide (IrO$_2$), platinum (Pt), ruthenium (Ru), ruthenium oxide (RuO$_2$), aluminum or combination thereof. The local plate patterns PP are two-dimensionally arrayed along the row direction (y-axis) and the column direction (x-axis).

In more detail, each of the local plate patterns PP covers the ferroelectric capacitors, which are arrayed in at least two adjacent rows and at least one column. For example, the respective local plate patterns PP cover four ferroelectric capacitors 82, which are arrayed in two adjacent rows and two adjacent columns as shown in FIG. 25. The respective local plate patterns PP are disposed along the row direction (y-axis). As a result, each of the local plate patterns PP is in direct contact with the top electrodes 81, which are arrayed in at least two adjacent rows and at least one column. The substrate including the local plate patterns PP is covered with an upper interlayer insulating layer. The upper interlayer insulating layer may comprise sequentially formed first and second upper interlayer insulating layers 89 and 93.

In addition, a plurality of main word lines 91 may be interposed between the first and second upper interlayer insulating layers 89 and 93, as described with reference to the embodiments of FIGS. 4 and 5. Generally, each of the main word lines 91 controls four word lines 57 through a decoder. A main plate line 97 is disposed in the upper interlayer insulating layer between the main word lines 91. The main plate line 97 is electrically connected to the local plate patterns PP, which are arrayed along the row direction (y-axis), through a plurality of via holes 95c that penetrate the upper interlayer insulating layer. The main plate line 97 may be electrically connected to the local plate patterns PP, which are arrayed along the row direction (y-axis), through the slit-type via hole (95 of FIG. 4) that penetrates the upper-interlayer insulating layer.

Referring to FIGS. 25 and 26 again, a lower plate layer is formed on the entire surface of the substrate having the ferroelectric capacitors 82 and the insulating layer pattern 85a. The lower plate layer may include a metal, a conductive metal oxide, a conductive metal nitride or a combination thereof. In more detail, the lower plate layer may include titanium aluminum nitride (TiAlN), titanium (Ti), titanium nitride (TiN), iridium (Ir), iridium oxide (IrO$_2$), platinum (Pt), ruthenium (Ru), a ruthenium oxide (RuO$_2$), aluminum or combination thereof.

The lower plate layer is patterned to form a plurality of local plate patterns PP. Each of the local plate patterns PP covers the ferroelectric capacitors 82, which are arrayed in at least two adjacent rows and at least one column. For example, the respective local plate patterns PP is in direct contact with four top electrodes 81, which are arrayed in two adjacent rows and two adjacent columns. Thus, it is possible to remarkably reduce the physical stress due to the local plate patterns PP, as compared to the first embodiment of the invention that employs the local plate line. In particular, in the event that lower plate layer is formed of a material layer having high stress such as the iridium layer and/or the iridium oxide layer, the physical stress due to the local plate patterns PP may be much lower than that due to the local plate line 87 in the embodiments of FIGS. 4 and 5. Therefore, in the event that the local plate patterns PP are formed instead of the local plate line 87 as in this modified embodiment, the physical stress applied to the ferroelectric capacitors 82 can be significantly reduced. As a result, it is possible to prevent the ferroelectric capacitors 82 from being degraded.

An upper interlayer insulating layer is formed on the entire surface of the substrate having the local plate patterns PP. The upper interlayer insulating layer is formed by sequentially forming a first upper interlayer insulating layer and a second interlayer insulating layer 89 and 93. A plurality of main word lines 91 may be formed on the first upper interlayer insulating layer 89 prior to formation of the second upper interlayer insulating layer 93. Here, each of the main word lines 91 generally controls four word lines 57 through a decoder.

The upper interlayer insulating layer is patterned to form a plurality of via holes 95c that expose the local plate patterns PP. As a result, the plurality of via holes 95c are two-dimensionally arrayed along the x-axis and the y-axis. Slit-type via holes (95 of FIGS. 5 and 13) may be formed instead of the plurality of via holes 95c. An upper plate layer such as a metal layer is formed on the entire surface of the substrate having the via holes 95c. The upper plate layer is then patterned to form a main plate line 97 that covers the plurality of via holes 95c. The main plate line 97 is formed to be parallel with the y-axis as shown in FIG. 25.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A ferroelectric memory device comprising:
a microelectronic substrate;
a plurality of ferroelectric capacitors on the substrate, arranged as a plurality of rows and columns in respective row and column directions; and
a plurality of parallel plate lines overlying the ferroelectric capacitors and extending along the row direction, wherein a plate line contacts ferroelectric capacitors in adjacent rows.

2. The ferroelectric memory device of claim 1, wherein the plate line contacts the ferroelectric capacitors in at least two adjacent rows and at least one column.

3. The ferroelectric memory device of claim 1, wherein the ferroelectric capacitors comprise an upper electrode, and wherein each of the plate lines comprises a plurality of local plate lines that are spaced apart and arrayed in the row direction, each of the local plate lines being in contact with upper electrodes of the ferroelectric capacitors in adjacent rows.

4. The ferroelectric memory device of claim 3, wherein the local plate lines are composed of a titanium aluminum nitride layer (TiAlN), a titanium layer (Ti), a titanium nitride layer (TiN), an iridium layer (Ir), an iridium oxide layer ($IrO_2$), a platinum layer (Pt), a ruthenium layer (Ru), a ruthenium oxide layer ($RuO_2$), an aluminum layer (Al) or a combination layer thereof.

5. The ferroelectric memory device of claim 1, further comprising an insulating layer on the ferroelectric capacitors, and wherein the plate lines comprise a main plate line disposed on the insulating layer and contacting the ferroelectric capacitors through holes in the insulating layer.

6. The ferroelectric memory device of claim 5, wherein each of the holes exposes the ferroelectric capacitors in at least two adjacent rows and at least one column.

7. The ferroelectric memory device of claim 1, wherein each of the ferroelectric capacitors includes a bottom electrode, a ferroelectric layer pattern, and a top electrode, and wherein respective ones of the plate lines contact the top electrodes on respective pairs of adjacent rows.

8. The ferroelectric memory device of claim 7, further comprising an insulating layer pattern filling gaps between the ferroelectric capacitors.

9. A ferroelectric memory device comprising:
a semiconductor substrate;
a plurality of ferroelectric capacitors two-dimensionally arrayed along row and column directions on the semiconductor substrate; and
a plurality of local plate patterns covering the ferroelectric capacitors and two-dimensionally arrayed along the row and column directions, wherein each of the local plate patterns is in direct contact with top surfaces of the ferroelectric capacitors which are arrayed in at least two adjacent rows and at least two adjacent columns.

10. The ferroelectric memory device of claim 9, wherein the local plate patterns comprise at least one of titanium aluminum nitride (TiAlN), titanium (Ti), titanium nitride (TiN), iridium (Ir), iridium oxide ($IrO_2$), platinum (Pt), ruthenium (Ru), ruthenium oxide ($RuO_2$), and aluminum (Al).

11. The ferroelectric memory device of claim 9, wherein each of the ferroelectric capacitors comprises a bottom electrode, a ferroelectric layer pattern and a top electrode which are sequentially stacked, each of the local plate patterns being in direct contact with top surfaces of the top electrodes which are arrayed in at least two adjacent rows and at least two adjacent columns.

12. The ferroelectric memory device of claim 11, wherein the respective local plate patterns is are in direct contact with the top surfaces of four top electrodes which are arrayed in two adjacent rows and two adjacent columns.

13. The ferroelectric memory device of claim 9 further comprises a plurality of main plate lines which are arrayed to be parallel with the row direction, each of the main plate lines being electrically connected to the local plate patterns which are arrayed along the row direction.

14. The ferroelectric memory device of claim 13, wherein each of the main plate lines is electrically connected to the local plate patterns through a plurality of via holes or a slit-type via hole.

15. The ferroelectric memory device of claim 14 further comprises a plurality of main word lines which are disposed to be parallel with the row direction at both sides of the silt-type via hole or the via holes, the main word lines are located at a level of which is higher than that of the local plate patterns and lower than that of the main plate lines.

* * * * *

UNITED STATES PATENT AND TRADEMARK OFFICE
CERTIFICATE OF CORRECTION

PATENT NO. : 7,285,810 B2  Page 1 of 1
APPLICATION NO. : 10/948610
DATED : October 23, 2007
INVENTOR(S) : Kim et al.

It is certified that error appears in the above-identified patent and that said Letters Patent is hereby corrected as shown below:

Column 1, Line 8: Please correct "Ferroeleciric"
 To read -- Ferroelectric --

Column 14, Line 27: Please correct "patterns is are"
 To read -- patterns are --

Signed and Sealed this

First Day of January, 2008

JON W. DUDAS
*Director of the United States Patent and Trademark Office*